US012749927B2

(12) United States Patent
Trock et al.

(10) Patent No.: US 12,749,927 B2
(45) Date of Patent: Sep. 29, 2026

(54) ELECTRONIC DEVICES AND METHODS FOR NON-CONTACT HARDWARE SHUTDOWN AND/OR RESET OF ELECTRONIC DEVICES

(71) Applicant: MEDTRONIC MINIMED, INC., Northridge, CA (US)

(72) Inventors: Adam S. Trock, Simi Valley, CA (US); Fatemeh Delijani, Chatworth, CA (US); Jalal Elidrissi, Santa Clarita, CA (US); Carlos A. Ayala, Glendale, CA (US); Vijaya Kumar Parari, Woodland Hills, CA (US); Afshin Bazargan, Simi Valley, CA (US)

(73) Assignee: MEDTRONIC MINIMED, INC., Northridge, CA (US)

( * ) Notice: Subject to any disclaimer, the term of this patent is extended or adjusted under 35 U.S.C. 154(b) by 491 days.

(21) Appl. No.: 18/055,355

(22) Filed: Nov. 14, 2022

(65) Prior Publication Data

US 2023/0155425 A1 May 18, 2023

Related U.S. Application Data

(60) Provisional application No. 63/279,961, filed on Nov. 16, 2021.

(51) Int. Cl.
*H02J 50/80* (2016.01)
*H02J 7/70* (2026.01)
(Continued)

(52) U.S. Cl.
CPC ................ *H02J 50/80* (2016.02); *H02J 7/70* (2026.01); *H02J 7/90* (2026.01); *H02J 50/10* (2016.02);
(Continued)

(58) Field of Classification Search
CPC .......... H02J 50/80; H02J 50/10; H02J 7/0042; H02J 7/007; H04W 52/0267; G01R 33/072
(Continued)

(56) References Cited

U.S. PATENT DOCUMENTS 8,805,530 B2 * 8/2014 John ........................ H04B 5/77 607/34
8,823,497 B2 * 9/2014 Hutzler ................. G07F 7/0833 235/382
(Continued)

FOREIGN PATENT DOCUMENTS

JP 2019153044 A 9/2019
WO 2020056673 A1 3/2020
(Continued)

OTHER PUBLICATIONS

International Search Report and Written Opinion dated Apr. 19, 2023 in PCT Application No. PCT/US2022/079895.
(Continued)

*Primary Examiner* — Alfonso Perez Borroto
(74) *Attorney, Agent, or Firm* — Weaver Austin Villeneuve & Sampson LLP

(57) ABSTRACT

An electronic device includes a battery, a system load, a switch in an electrical connection path between the battery and the system load, a non-contact sensor configured to detect a wireless control signal associated with an instruction, a control circuit configured to open the switch to disconnect the battery and the system load in response to the detected wireless control signal, and a charging interface configured to receive electric power from an external source, where the control circuit and the non-contact sensor are powered through the charging interface rather than the battery.

17 Claims, 14 Drawing Sheets

(51) Int. Cl.

| | |
|---|---|
| ***H02J 7/90*** | (2026.01) |
| ***H02J 50/10*** | (2016.01) |
| ***H04W 52/02*** | (2009.01) |
| *G01R 33/07* | (2006.01) |

(52) U.S. Cl.

CPC ....... *H04W 52/0267* (2013.01); *G01R 33/072* (2013.01)

(58) Field of Classification Search

USPC .......................................................... 307/104

See application file for complete search history.

(56) References Cited

U.S. PATENT DOCUMENTS

| | | | | |
|---|---|---|---|---|
| 9,323,912 | B2 * | 4/2016 | Schultz | G06F 21/32 |
| 9,800,966 | B2 * | 10/2017 | Hirsch | H04R 1/1025 |
| 10,128,699 | B2 * | 11/2018 | Leabman | H02J 50/80 |
| 10,372,179 | B1 | 8/2019 | Mirov | |
| 10,534,203 | B2 * | 1/2020 | Olgun | H04B 1/18 |
| 2005/0078481 | A1 | 4/2005 | Hanis et al. | |
| 2006/0279258 | A1 * | 12/2006 | Jung | H02J 50/10 320/166 |
| 2010/0207771 | A1 | 8/2010 | Trigiani | |
| 2013/0205060 | A1 * | 8/2013 | Benhard | H02J 50/10 710/303 |
| 2013/0317753 | A1 * | 11/2013 | Kamen | G06F 3/0481 600/595 |
| 2016/0087480 | A1 * | 3/2016 | Trudeau | G06F 1/24 320/108 |
| 2016/0261151 | A1 | 9/2016 | Kim et al. | |
| 2017/0279165 | A1 * | 9/2017 | Tanii | G01R 31/392 |
| 2018/0090958 | A1 | 3/2018 | Steger et al. | |
| 2018/0372806 | A1 * | 12/2018 | Laughery | H02J 7/00 |
| 2019/0068004 | A1 * | 2/2019 | Louis | H02J 50/12 |
| 2020/0067342 | A1 | 2/2020 | Kim et al. | |
| 2020/0136434 | A1 * | 4/2020 | Leeks | H02J 50/12 |
| 2020/0261644 | A1 * | 8/2020 | Farnan | G16H 40/67 |
| 2020/0266661 | A1 * | 8/2020 | Park | G06F 1/189 |
| 2021/0160783 | A1 | 5/2021 | Park et al. | |
| 2022/0179213 | A1 * | 6/2022 | Zhou | H02J 50/10 |
| 2023/0155424 | A1 | 5/2023 | Trock et al. | |
| 2023/0156604 | A1 * | 5/2023 | Trock | H02J 50/80 455/566 |

FOREIGN PATENT DOCUMENTS

| | | | |
|---|---|---|---|
| WO | 2020192459 | A1 | 10/2020 |
| WO | 2023091912 | A1 | 5/2023 |

OTHER PUBLICATIONS

Invitation to Pay Additional Fees and, Where Applicable, Protest Fee dated Feb. 27, 2023 in PCT Application No. PCT/US2022/079895.

International Preliminary Report on Patentability and Written Opinion dated May 30, 2024 in PCT Application No. PCT/US2022/079895.

U.S. Restriction Requirement dated Feb. 10, 2025 in U.S. Appl. No. 18/055,350.

U.S. Final Office Action dated Oct. 14, 2025 in U.S. Appl. No. 18/055,345.

U.S. Non-Final Office Action dated Jul. 24, 2025 in U.S. Appl. No. 18/055,350.

US Non-Final Office Action dated Jun. 4, 2025 in U.S. Appl. No. 18/055,345.

U.S. Final Office Action dated Feb. 6, 2026 in U.S. Appl. No. 18/055,350.

U.S. Notice of Allowance dated Jan. 5, 2026 in U.S. Appl. No. 18/055,345.

EP Office Action dated May 8, 2026 in EP Application No. 22822815.1.

U.S. Notice of Allowance dated Apr. 20, 2026 in U.S. Appl. No. 18/055,345.

U.S. Notice of Allowance dated Apr. 21, 2026 in U.S. Appl. No. 18/055,350.

U.S. Notice of Allowance dated Aug. 3, 2026 in U.S. Appl. No. 18/055,345.

* cited by examiner

ELECTRONIC DEVICES AND METHODS FOR NON-CONTACT HARDWARE SHUTDOWN AND/OR RESET OF ELECTRONIC DEVICES

CROSS-REFERENCE TO RELATED APPLICATIONS

This application claims the benefit of and priority to U.S. Provisional Patent Application No. 63/279,961, filed Nov. 16, 2021, entitled "SYSTEMS AND METHODS FOR NON-CONTACT HARDWARE SHUTDOWN AND/OR RESET OF ELECTRONIC DEVICES," which is herein incorporated by reference in its entirety for all purposes.

The following three U.S. patent applications (including this one) are being filed concurrently, and the entire disclosures of the other applications are herein incorporated by reference into this application for all purposes:

- application Ser. No. 18/055,345, filed Nov. 14, 2022, entitled "SYSTEMS AND METHODS FOR NON-CONTACT HARDWARE SHUTDOWN AND/OR RESET OF ELECTRONIC DEVICES"; and
- application Ser. No. 18/055,350, filed Nov. 14, 2022, entitled "AUXILIARY DEVICES AND METHODS FOR NON-CONTACT HARDWARE SHUTDOWN AND/OR RESET OF ELECTRONIC DEVICES"; and
- application Ser. No. 18/055,355, filed Nov. 14, 2022, entitled "ELECTRONIC DEVICES AND METHODS FOR NON-CONTACT HARDWARE SHUTDOWN AND/OR RESET OF ELECTRONIC DEVICES."

TECHNICAL FIELD

The present disclosure relates generally to electronic devices, and more particularly to electronic devices and methods for non-contact hardware shutdown and/or reset of electronic devices with no on-board user interface features for hardware shutdown and/or reset.

BACKGROUND

Electronic devices including embedded processors or other control units (e.g., central processing units, microprocessors, microcontrollers, etc.) may sometimes suffer from hardware and/or software anomalies that can impact the functionality of the electronic devices. For example, some anomalies may impact the processing, communication, and/or control functionality of the control units, thereby disabling the recovery of the electronic devices from the anomalies using the control units. In many cases, the hardware and/or software anomalies may be cured by removing and reapplying power to the electronic devices. In some electronic devices, the removal and reapplication of power may be trivial, and may be performed by, for example, disconnection and reconnection of a power cord, removal and reinsertion of a battery, or appropriate operations on a user interface of the electronic devices. However, some electronic devices may not have easily accessible batteries or suitable user interface features for removal and/or reapplication of power.

SUMMARY

The present disclosure relates to systems and methods for non-contact hardware shutdown and/or reset of electronic devices. The systems and methods of the present disclosure may be particularly applicable for use with battery-powered electronic devices without accessible batteries (e.g., due to hermetic sealing) or suitable on-board user interface features (e.g., due to limited size or for safety reasons) to facilitate the removal and subsequent reapplication of power for the hardware shutdown and/or reset. The systems and methods of the present disclosure enable non-contact hardware shutdown and/or reset independent of other processing, communication, and component functionality of the electronic device, thus enabling shutdown and/or reset even if such processing, communication, and/or component functionality is impaired. Circuits for hardware shutdown and/or reset on the electronic device disclosed herein may be exclusively powered by a wireless charging device (rather than an on-device battery), and thus the hardware shutdown and/or reset may only be performed when the electronic device is being charged, such that accidental, unintentional, or other inadvertent shutdown/reset of the electronic device during normal use may be prevented.

According to certain embodiments, an electronic device may include a battery, a system load, a switch in an electrical connection path between the battery and the system load, a non-contact sensor configured to detect a wireless control signal associated with an instruction, a control circuit configured to open the switch to disconnect the battery and the system load in response to the detected wireless control signal, and a charging interface configured to receive electric power from an external source, where the control circuit and the non-contact sensor may be powered through the charging interface rather than the battery.

According to certain embodiments, a method of non-contact hardware shutdown and/or reset of an electronic device may include, at an electronic device, receiving wireless power signals from a charging device to power a non-contact sensor and a control circuit of the electronic device; receiving a wireless control signal from the charging device by the non-contact sensor; generating, by the control circuit in response to the received wireless control signal and after a first time delay that is greater than 1 second, a control signal to open a switch to disconnect a system load from a battery of the electronic device; and ceasing to receive the wireless power signals from the charging device. In some embodiments, the method may include receiving, after a second time delay, the wireless power signals from the charging device again to restart the system load.

BRIEF DESCRIPTION OF THE DRAWINGS

The above and other aspects and features of the present disclosure will become more apparent in view of the following detailed description when taken in conjunction with the accompanying drawings wherein like reference numerals identify similar or identical elements.

DETAILED DESCRIPTION

Figure 1:
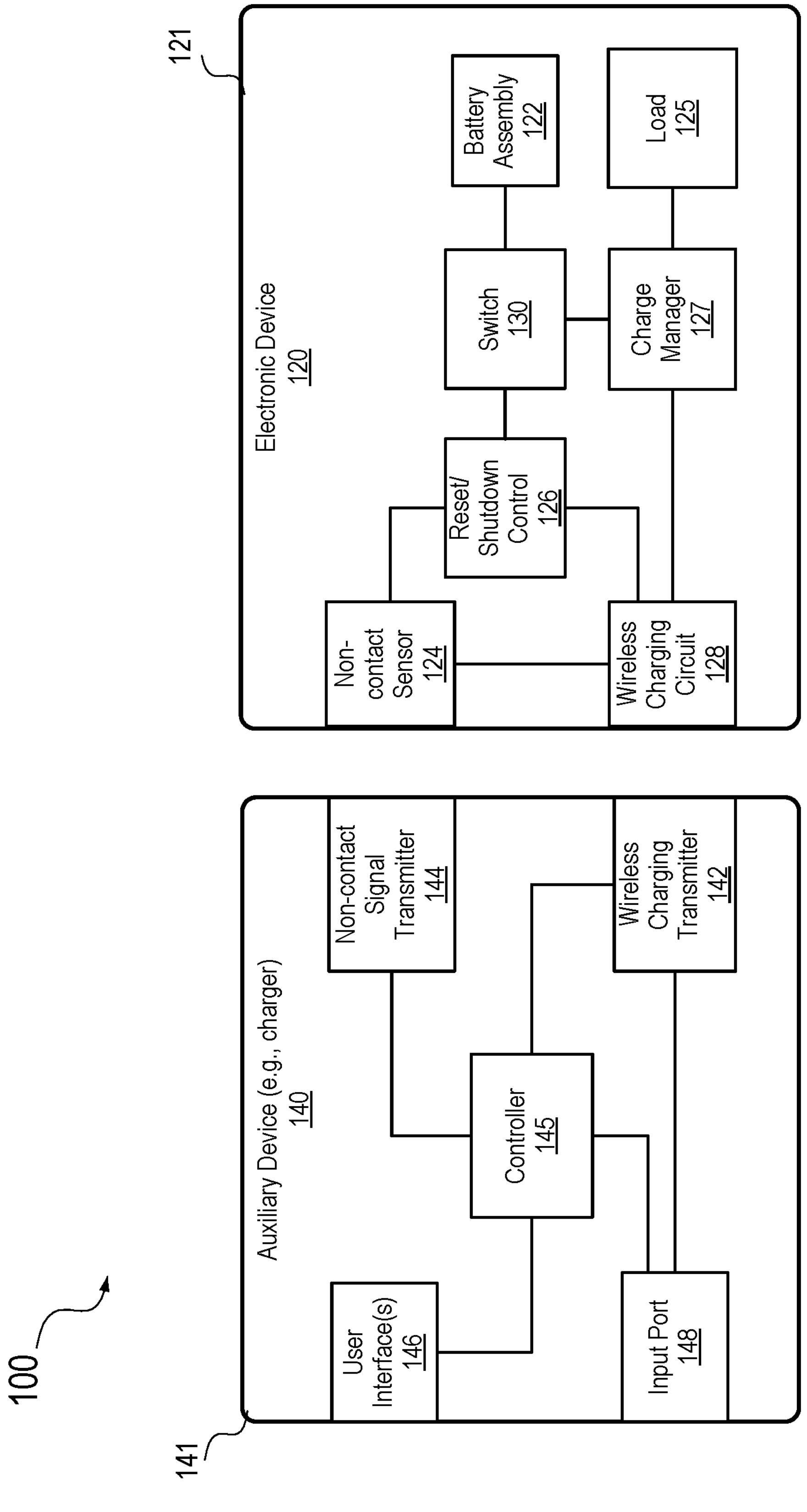
FIG. 1 is a block diagram of an example of a system including an electronic device and an auxiliary device enabling non-contact hardware shutdown and/or reset of the electronic device in accordance with certain aspects of the present disclosure.

This disclosure relates generally to techniques for non-contact hardware shutdown and/or reset of electronic devices, such as battery-powered electronic devices that may have no easy access to batteries or suitable on-board user interface features for mechanically and/or electrically disconnecting and/or reconnecting the system load to a power supply (e.g., a battery). Various inventive embodiments are described herein, including devices, systems, methods, structures, processes, and the like.

An electronic device may sometimes suffer from hardware and/or software anomalies that may need to be cured by powering down and/or resetting (e.g., rebooting) the electronic device or at least a system load (e.g., including a control unit such as a microcontroller, a processor, etc.) of the electronic device. For example, some anomalies may impact the processing, communication, or other functionality of the control unit, and thus the control unit may not be used to manage the shutdown or reset process. Therefore, to shut down or reset the electronic device, one may need to mechanically or electrically remove and/or reapply power (e.g., from a battery) to the electronic device or at least the control unit. In some electronic devices, the removal and/or reapplication of the power may be performed by, for example, disconnection and reconnection of a power cord, removal and reinsertion of a battery, or appropriate operations using a user interface of the electronic device (e.g., a button, a switch, a touch screen, etc.). However, in some portable electronic devices, such as many wearable medical devices, the batteries may not be easily accessible (e.g., due to hermetic sealing), and/or there may not be appropriate on-board user interface features (e.g., reset/shutdown button, switch, or touch screen) for manual reset or shutdown of the electronic device (e.g., due to limited size or safety reasons, such as to avoid unintentional shutdown/reset).

According to certain embodiments, an electronic device without on-board user interface features for shutdown/reset may be powered down or reset using an auxiliary device (e.g., a wireless charging device) that may have appropriate user interface feature(s) (e.g., button, switch, or touch screen) for receiving user requests for shutdown or reset. The auxiliary device, upon receiving user requests for shutdown or rest, may send a wireless control signal for shutdown or reset to the electronic device that may be placed on or adjacent to the auxiliary device. The auxiliary device may also include a wireless charging transmitter that can sent wireless power signals to the electronic device to power the electronic device for shutdown, reset, and/or battery charging. User requests for reset or shutdown of the electronic device may be wirelessly communicated to the electronic device through, for example, infrared (IR) signals, magnetic signals, near-field communication signals, and the like, from the auxiliary device.

The electronic device may include a non-contact sensor (e.g., an infrared receiver and/or demodulator, a Hall-effect detector, etc.) that can detect the wireless control signals transmitted by the auxiliary device. The non-contact sensor may be powered by the wireless charging power rather than the battery of the electronic device, and thus may be used even when the battery is disconnected. The electronic device may also include reset/shutdown control circuitry that is also powered by the wireless charging power (rather than the battery) and is not controlled by the control unit(s) of the electronic device, and thus may be used to control the shutdown and/or reset sequence even after the battery is disconnected. The reset/shutdown control circuitry, upon receiving the user requests for reset or shutdown from the non-contact sensor, may initiate and manage the shutdown and/or reset sequence of the electronic device. For example, the reset/shutdown control circuitry may include a timing circuit that can control the delay before the disconnection of the battery from the system load of the electronic device, the delay after the disconnection and before the reconnection of battery to the system load, and other timing of the shutdown and/or reset sequence.

In some embodiments, the auxiliary device may be able to distinguish the hardware reset request from the hardware shutdown request based on the user input, but may send the same wireless signal to the electronic device to shut down the electronic device, and may then perform different operations for hardware shutdown and hardware reset after the electronic device is shut down. For example, if the user requests a hardware shutdown of the electronic device, the auxiliary device may signal the user to remove the electronic device after the shutdown. If the user requests a hardware reset of the electronic device, the auxiliary device may charge the electronic device to restart the electronic device after the shutdown. In some embodiments, different wireless signals may be sent to the electronic device for the electronic device to distinguish a hardware reset request from a hardware shutdown request, and the electronic device may perform different operations for hardware reset and hardware shutdown. In some embodiments, the auxiliary device and/or the electronic device may include an output user interface (e.g., light emitting diodes) for indicating status (e.g., powered down, charging, after reset, etc.) of the auxiliary device and/or the electronic device, such that users may engage or disengage the electronic device and the auxiliary device at appropriate time.

Techniques disclosed herein enable time-controlled, non-contact hardware shutdown and/or reset of an electronic device that may be independent of the processing, communication, or other functionality of the electronic device (e.g., functionality of control unit(s) of the electronic device), and thus can be used for hardware shutdown and/or reset of electronic devices that have no appropriate on-board user interface features for hardware shutdown and reset, even when the processing, communication, or other functionality of the electronic device is impaired, and even when the battery of the electronic device is disconnected. Techniques disclosed herein may be used in, for example, wearable medical devices that have no on-board user interface features (e.g., buttons or switches) for hardware shutdown or reset to avoid accidental, unintentional reset or shutdown of the wearable medical devices, and/or other battery-powered portable devices that have no on-board user interface features for hardware shutdown or reset to shut down the portable devices to save power or extend battery life when the portable devices are not in use. For example, as described above, the reset/shutdown control circuitry may be powered by the wireless charging power rather than the battery, and thus may not be functional when the electronic device (e.g., a wearable medical device) is not charged, such as during normal use (powered by the battery), such that accidental, unintentional, or any other inadvertent reset or shutdown of the wearable medical device can be avoided.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a block diagram of an example of a system 100 including an electronic device 120 and an auxiliary device 140 enabling non-contact hardware shutdown and/or reset of electronic device 120 in accordance with certain aspects of the present disclosure. Electronic device 120 may be a portable electronic device or wearable electronic device (e.g., a wearable medical device) that may be powered by a rechargeable or non-rechargeable battery. Auxiliary device 140 may include, for example, a wireless charging device. Electronic device 120 may be placed on auxiliary device 140, docked to or engaged with auxiliary device 140, or otherwise placed in the vicinity of auxiliary device 140, and may be removable from auxiliary device 140. In some embodiments, electronic device 120 may be a reusable portion (e.g., the electronics) of a wearable medical device (e.g., a patch insulin pump), and auxiliary device 140 may have the same shape as a disposable portion (e.g., including an insulin container) of the wearable medical device, such that electronic device 120 and auxiliary device 140 may be engaged to align properly and form a system with a substantially continuous outer enclosure.

In the illustrated example, electronic device 120 may include a housing 121 substantially enclosing a battery assembly 122, a non-contact sensor 124, a reset/shutdown control circuit 126, a wireless charging circuit 128, a charge manager 127, a load 125, and a switch 130. In some embodiments, battery assembly 122 of electronic device 120 may be inaccessible or may not be easily accessible. For example, housing 121 may form or may be part of a fluid-tight or hermetically sealed enclosure. In some embodiments, electronic device 120 may also be devoid of a user interface (e.g., a button, a mechanical switch, or a touch screen on housing 121) that would enable manual hardware shutdown and/or reset by users, for example, for safety reasons (e.g., to avoid unintentional reset or power down) and/or due to the limited size of electronic device 120. Electronic device 120 may include additional components and/or features (e.g., included in load 125 or not shown in FIG. 1) depending on, for example, the function and application of electronic device 120, which may be a medical device, a power tool, a consumer electronic device, a communication device, an industrial device, and the like.

Load 125 may be any power-consuming features of electronic device 120 that enable the functionality of, for example, processors, energy storage devices, motors, generators, transducers, and other hardware components. For example, load 125 may include the main functional portions of electronic device 120, such as one or more microcontrollers, microprocessors, data communication circuits, sensors, actuators, motor controllers, and the like. Load 125 may be electrically connected to battery assembly 122 through a charge manager 127 and a switch 130, and may normally be powered by battery assembly 122, which may include a rechargeable or non-rechargeable battery. Battery assembly 122 may include a battery having one or more battery cells. In some embodiments, battery assembly 122 may include charge and/or protection circuitry for charge, discharge, and/or protection of the battery. Load 125 may also be powered by power from wireless charging circuit 128 through charge manager 127, which may be able select power from either battery assembly 122 or wireless charging circuit 128 for powering load 125. Charge manager 127 may also be used to charge a rechargeable battery of battery assembly 122.

Reset/shutdown control circuit 126 may be used to enable a hardware shutdown and/or reset sequence. For example, reset/shutdown control circuit 126 can be used to turn on or off switch 130 to disconnect and/or reconnect load 125 and battery assembly 122, after a certain time delay or according to a certain timing sequence, upon receiving a reset/shutdown request signal. In one example, reset/shutdown control circuit 126 may include a timing circuit, such as a clocking circuit (e.g., a crystal oscillator) and a timer (e.g., a clock counter) that can be used to control the time delay before disconnecting battery assembly 122, and/or the time delay after disconnecting battery assembly 122 and before reconnecting battery assembly 122. In some embodiments, reset/shutdown control circuit 126 may control switch 130 through a battery protection circuit. Reset/shutdown control circuit 126 may receive reset/shutdown request signals from non-contact sensor 124 when there is no on-board user interface (e.g., button or touch screen) for receiving reset/shutdown requests from a user. Reset/shutdown control circuit 126 may not be powered by battery assembly 122, and thus may not be functional during the normal use of electronic device 120 (e.g., worn by a user), thereby preventing accidental, unintentional, or other inadvertent shutdown/reset of the electronic device during normal use.

Non-contact sensor 124 may be any suitable non-contact sensor configured to detect a non-contact signal from auxiliary device 140, such as, for example, an electromagnetic sensor configured to detect electromagnetic signals, an optical sensor (e.g., infrared photodetector) configured to detect optical signals (e.g., infrared light signals), a Hall-effect sensor configured to detect magnetic field signals, or another electrical and/or magnetic field sensor, such as a magnetoresistive position sensor (e.g., 1-axis, 2-axis, or 3-axis), a fluxgate sensor, a superconducting quantum interference device (SQUID), a resonant sensor, an induction magnetometer, a linear variable differential transformer, an Eddy current sensor, a variable reluctance sensor, a magnetic encoder, a permanent magnet linear contactless displacement sensor, and the like. Non-contact sensor 124 may generate a signal in response to detecting the non-contact signal from auxiliary device 140 and provide the signal to reset/shutdown control circuit 126, or, in some embodiments, directly to switch 130. For example, non-contact sensor 124 may provide the received reset/shutdown request signal to reset/shutdown control circuit 126, which may include a countdown timer circuit that can provide a suitable signal to change the state of switch 130 after expiration of a predetermined time period as described above. As reset/shutdown control circuit 126, non-contact sensor 124 may not be powered by battery assembly 122 either, and thus may not be functional during the normal use of electronic device 120, thereby preventing accidental, unintentional, or other inadvertent triggering of the shutdown/reset of the electronic device during normal use.

Switch 130 may in the electrical connection path between battery assembly 122 and load 125 (e.g., through charge manager 127). In some embodiments, switch 130 may include a power relay or another electrical or electromechanical switch that can be switched on (to a closed state) or off (to an open state) using a switch control signal. When switch 130 is switched, for example, from the closed state to the open state, battery assembly 122 may be disconnected from load 125 and charge manager 127, thereby removing power from load 125 to shut down electronic device 120. When switch 130 is switched, for example, from the open state to the closed state, battery assembly 122 may be reconnected to load 125, thereby restarting electronic device 120. In this manner, switch 130 can be switched independently of a microcontroller unit (MCU) or other processor(s) of electronic device 120 that may be parts of load 125. Therefore, hardware shutdown or reset can be accomplished independently of the MCU or other processor(s) of electronic device 120.

When a shutdown request is received (e.g., through non-contact sensor 124), reset/shutdown control circuit 126 may generate a switch control signal to set switch 130 to the open state to disconnect battery assembly from load 125 such that electronic device 120 may no longer consume power from battery assembly 122. In some embodiments, when a reset request is received (e.g., through non-contact sensor 124), reset/shutdown control circuit 126 may, after setting switch 130 to the open state to disconnect battery assembly from load 125, setting switch 130 to the closed state after a delay to reconnect battery assembly 122 to load 125, thereby restoring power to electronic device 120, such that electronic device 120 may be restart or reboot. In some embodiments, electronic device 120 may be reset upon a subsequent power-on after shutdown, upon receiving wireless power signals through wireless charging circuit 128, upon cessation of detection of non-contact signals by non-contact sensor 124, upon receipt of a suitable signal from another component of electronic device 120, and/or in any other suitable manner.

Wireless charging circuit 128 may be a charging interface and may include, for example, an antenna, a wireless charging receiver, and/or a charge management circuit. Wireless charging circuit 128 may receive wireless electric power signals from auxiliary device 140 through the antenna (e.g., including an inductive coil or a capacitive coupling device). In some embodiments, wireless charging circuit 128 may include, for example, a Qi power receiver. Reset/shutdown control circuit 126 and non-contact sensor 124 may be powered by wireless charging circuit 128, rather than battery assembly 122. In some embodiments, charge manager 127 may receive electric power from the wireless charging receiver of wireless charging circuit 128, and provide the electric power to load 125 and/or charge a rechargeable battery of battery assembly 122, when electronic device 120 is docked to, engaged with, or placed on auxiliary device 140.

Auxiliary device 140 may be any suitable device configured to interact with electronic device 120 to provide wireless charging power and/or non-contact signals (e.g., for hardware reset/shutdown request). In some embodiments, auxiliary device 140 may also interact with electronic device 120 in other ways and/or for other purposes. For example, auxiliary device 140 may be configured as one or more of: a charger configured to charge battery assembly 122 of electronic device 120; a dock configured to support electronic device 120 and, in some embodiments, connect electronic device 120 to one or more peripheral devices; a peripheral device connectable to electronic device 120; a device to which electronic device 120 is connectable as a peripheral device or as part of a system; a communication device configured to communicate with electronic device 120; or a device for download data from or upload data to a storage device or a cloud. In the illustrated example, auxiliary device 140 may include an enclosure 141 and components enclosed by enclosure 141, such as a wireless charging transmitter 142, a non-contact signal transmitter 144, one or more user interfaces 146, an input port 148, a controller 145, and the like. Auxiliary device 140 may also include additional components and/or features not shown in FIG. 1, depending on, for example, the specific function and application of auxiliary device 140.

Input port 148 may include, for example, various types of Universal Serial Bus (USB) ports, or other connector devices for receiving data and/or power through a cable. In some embodiments, a voltage regulator may be used to regulate the voltage signal from input port 148 and provide a DC voltage level to controller 145, which may be a microcontroller unit (MCU) of auxiliary device 140. Controller 145 may control the operations of auxiliary device 140. For example, controller 145 may control wireless charging transmitter 142 to transmit wireless power signals through a coil or another transmitting antenna; may control non-contact signal transmitter 144 for transmitting non-contact signals, such as non-contact control signals for powering down or resetting electronic device 120; and may receive user inputs and/or provide output through one or more user interfaces 146. In some embodiments, controller 145 may control power switches to disconnect or connect power input to wireless charging transmitter 142 and/or non-contact signal transmitter 144.

Non-contact signal transmitter 144 of auxiliary device 140 may be configured to provide a non-contact signal to electronic device 120 at an appropriate amplitude or intensity for reception and detection by non-contact sensor 124. For example, non-contact signal transmitter 144 may be configured to provide an optical signal (e.g., infrared light pulses), a magnetic field signal, an low-amplitude electromagnetic signal (e.g., compared with wireless power signals) such as a radio-frequency (RF) signal, and the like. In some embodiments, the non-contact signal provided by non-contact signal transmitter 144 may only be detectable by non-contact sensor 124 of electronic device 120 that is within a very short range from auxiliary device 140, such as, for example, within approximately 5 cm or closer, although other ranges are also contemplated.

The one or more user interfaces 146 may be used to, for example, receive user requests for powering down or resetting electronic device 120, provide status of auxiliary device 140 and/or electronic device 120 to users, and the like. For example, the one or more user interfaces 146 may include depressible buttons (e.g., including multi-stage buttons), sliders, mechanical switches, dials, and the like. In some embodiments, actuation of the one or more user interfaces 146 by a user may cause controller 145 to control non-contact signal transmitter 144 to generate the non-contact signal for detection by non-contact sensor 124 of electronic device 120. Alternatively or additionally, the actuation of the one or more user interfaces 146 by a user may itself provide the non-contact signal to electronic device 120. For example, in some embodiments, the one or more user interfaces 146 may include a slidable magnet that can be manually slid to two or more different positions to send different non-contact signals (e.g., for shutdown and reset requests) to initiate an action on electronic device 120. In another example, when the user slides the slidable magnet to different locations, non-contact sensor 124 (e.g., a Hall-effect sensor) of electronic device 120 may detect the changes in the magnetic field, and may identify the reset or shutdown request based on, for example, the number of times the user slides the slidable magnet and/or the duration of the slidable magnet at a position (e.g., the position closest to the Hall-effect sensor on electronic device 120).

In some embodiments, the particular manner of actuation, such as the combination of the actuations of the one or more user interfaces 146, the sequence of actuation of one or more user interfaces 146, and/or the duration of the actuation of one or more user interfaces 146, may correspond to a particular user request, and may be distinguishable by controller 145. In one example, one button on auxiliary device 140 may be used to initiate a hardware shutdown of electronic device 120, and another button on auxiliary device 140 may be used to initiate a hardware reset of electronic device 120. In another example, one button on auxiliary device 140 may be pressed and held for different respective durations to initiate a hardware shutdown and a hardware reset of electronic device 120, where controller 145 may determine the user input based on the duration the button has been pressed and held. Based on the user input, controller 145 may enable non-contact signal transmitter 144 to transmit a wireless control signal. In some embodiments, controller 145 may cause non-contact signal transmitter 144 to transmit the same wireless control signal for both hardware shutdown and hardware reset. In some other embodiments, controller 145 may cause non-contact signal transmitter 144 to transmit different non-contact signals that are distinguishable by non-contact sensor 124 of electronic device 120. In some embodiments, the one or more user interfaces 146 may directly connect to non-contact signal transmitter 144 to initiate output of the wireless control signal therefrom. In some embodiments, rather than actuation from user interfaces 146, some signals sent to controller 145 (or directly to non-contact signal transmitter 144) may be provided from another component or device that may be in communication with auxiliary device 140 wirelessly or through, for example, input port 148 (e.g., a USB port).

In some embodiments, the one or more user interfaces 146 may include an output user interface for providing status information to the user. For example, the one or more user interfaces 146 may include one or more visible light emitting diodes that may emit light of different colors and/or different light patterns (e.g., steady output and/or blinking at different frequencies), to indicate, for example, whether electronic device 120 is being charged, is reset, is powered down, or can be safely removed from auxiliary device 140.

Figure 2:
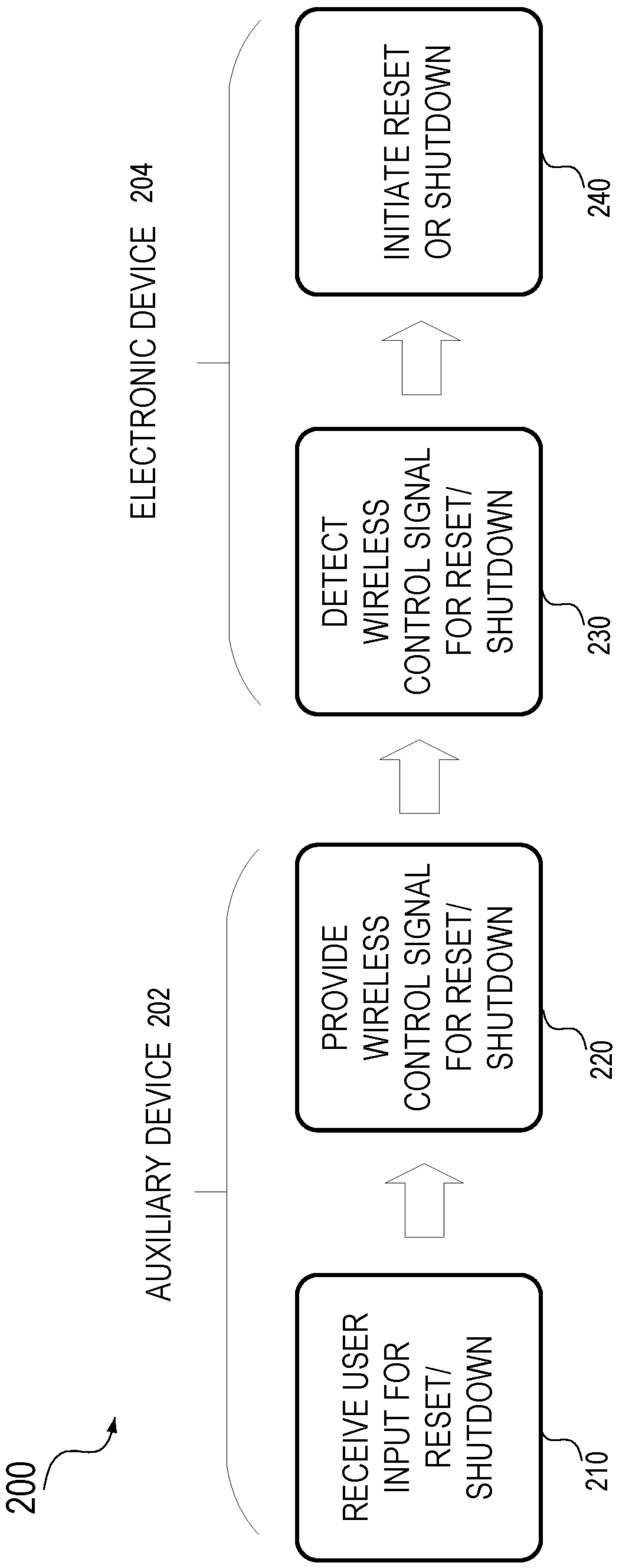
FIG. 2 is a flow diagram illustrating an example of a method of non-contact hardware shutdown and/or reset in accordance with certain aspects of the present disclosure.

FIG. 2 is a flow diagram 200 illustrating an example of a method of non-contact hardware shutdown and/or reset of an electronic device according to certain embodiments. The method may be performed by a system (e.g., system 100) that includes an auxiliary device 202 (e.g., an example of auxiliary device 140) and an electronic device 204 (e.g., an example of electronic device 120). In the illustrated example, when hardware reset and/or shutdown of electronic device 120 is desired, a user may actuate one or more user interfaces (e.g., user interfaces 146) of auxiliary device 202 in an appropriate manner. In some embodiments, a first manner of actuation of the one or more user interfaces may trigger a reset of electronic device 204, while a second manner of actuation of the one or more user interfaces may trigger a shutdown of electronic device 204. At block 210, auxiliary device 202 (e.g., a controller of auxiliary device 202) may receive the user request for reset or shutdown of electronic device 204 by detecting and determining the manner of actuation of the one or more user interfaces by the user. At block 220, auxiliary device 202 may directly or indirectly (e.g., through a controller) signals a non-contact signal transmitter (e.g., non-contact signal transmitter 144) of auxiliary device 202 to generate and output a wireless control signal to electronic device 204.

If electronic device 204 is sufficiently close to (e.g., placed on, docked to, or engaged with) auxiliary device 202, a non-contact sensor (e.g., non-contact sensor 124) of electronic device 204 may be able to detect the wireless control signal from the non-contact signal transmitter of auxiliary device 202, as shown by block 230. When the non-contact sensor detects a wireless control signal or, in some embodiments, a particular wireless control signal (e.g., a wireless control signal of a particular magnitude, duration, and/or other characteristics), the non-contact sensor may directly or indirectly initiate a reset or shutdown of electronic device 204, as shown by block 240. As described above and below, initiating a reset or shutdown of electronic device 204 may include, for example, starting a countdown timer, providing an input to a controller or other circuitry that a wireless control signal has been detected, providing a signal to directly or indirectly change the state of a power switch (e.g., switch 130) of electronic device 204, and the like. The initiation of a shutdown of electronic device 204 at block 240 may result in switching the power switch from a closed state to an open state, thereby disconnecting a battery (e.g., battery assembly 122) from the system load (e.g., load 125) of electronic device 204 to remove power from electronic device 204. Electronic device 204 may remain powered down until the battery is reconnected by, for example, switching the power switch from the open state to the closed state, or until electronic device 204 is charged again by auxiliary device 202. If a reset of electronic device 204 is initiated, reconnection/recharge and restart may be performed after the disconnection.

In the following descriptions, particular implementations of systems (e.g., system 100 of FIG. 1) and methods (e.g., the method of FIG. 2) for non-contact hardware shutdown and/or reset of electronic devices are detailed. The particular implementations are for illustration purposes only and are not intended to limit the present disclosure to the particular implementations described herein. To the extent consistent, any of the aspects and features detailed herein may be utilized in any suitable combination with one another, with system 100 of FIG. 1, and/or with the method of FIG. 2.

Figure 3:
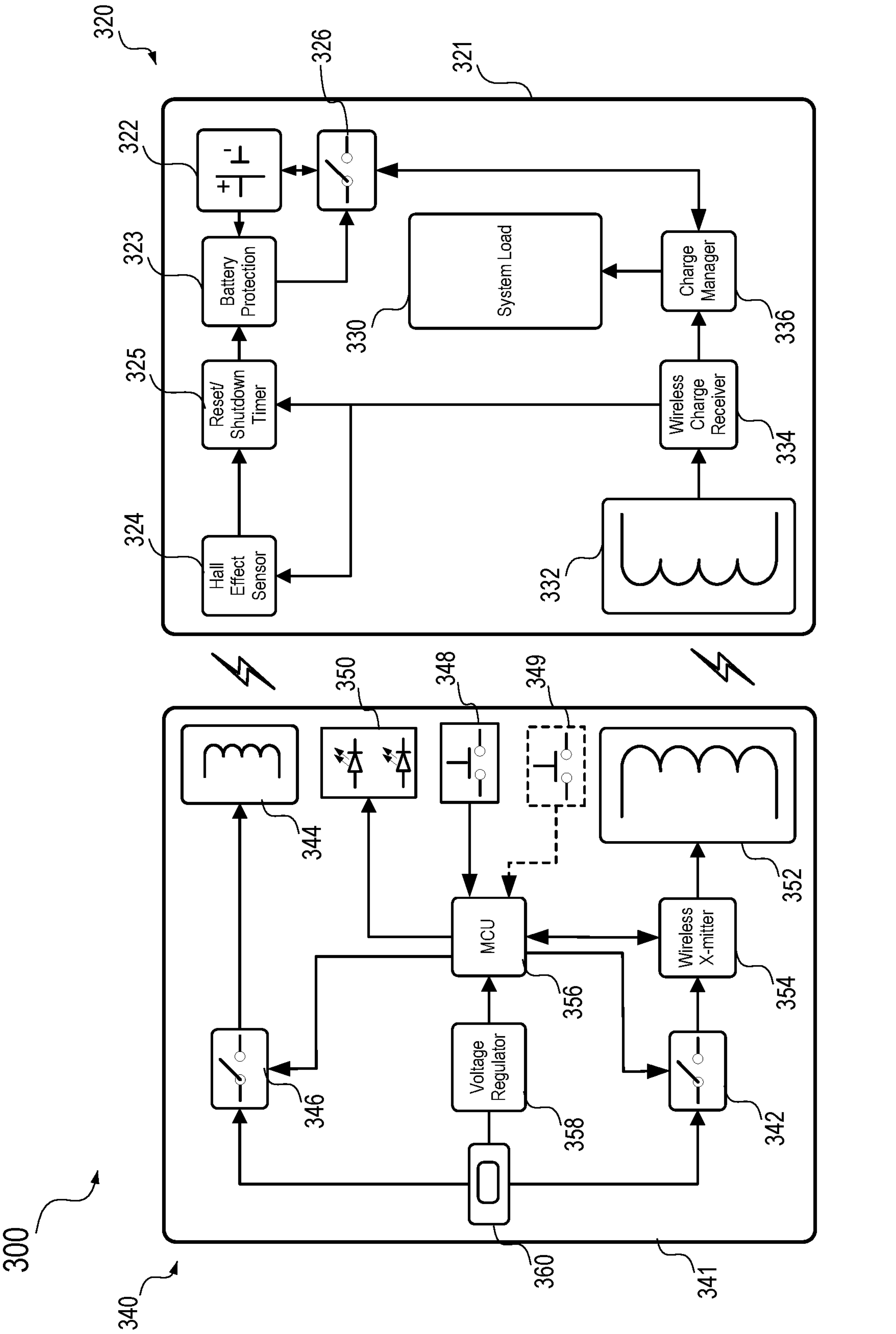
FIG. 3 illustrates an example of a system including an electronic device and an auxiliary device enabling non-contact hardware shutdown and/or reset of the electronic device according to certain embodiments.

FIG. 3 illustrates an example of a system 300 including an electronic device 320 and an auxiliary device 340 enabling non-contact hardware shutdown and/or reset of electronic device 320 according to certain embodiments. In the illustrated example, system 300 may be similar to system 100 of FIG. 1. Electronic device 320 may be a rechargeable, battery-powered, portable electronic device 320 without suitable user interfaces to enable hardware reset or shutdown thereof. Auxiliary device 340 may be a charger for electronic device 320. Although electronic device 320 and auxiliary device 340 are detailed below as configured for wireless power transfer to charge electronic device 320, contact-based charging of electronic device 320 may also be performed using certain features (e.g., a docking interface with electrical connections) of auxiliary device 340. To perform a hardware shutdown/reset, electronic device 320 may be placed on, docked to, or engage with auxiliary device 340.

As illustrated, electronic device 320 may include a housing 321 enclosing therein: a battery assembly including a battery 322 having one or more battery cells, and a battery protection circuit 323; a non-contact sensor such as, for example, a Hall-effect sensor 324; a reset/shutdown timer circuit 325; a switch 326; a system load 330; a wireless charging antenna (e.g., a coil 332); a wireless charge receiver 334; a charge manager circuit 336; and the like. The various circuits of electronic device 320 and/or other circuits detailed herein may be configured as integrated circuit (IC) chips provided on one or more circuit boards, or may have any other suitable configuration.

In some embodiments, battery 322 may be electrically connected to coil 332, wireless charge receiver 334, and/or charge manager circuit 336 for charging battery 322, and may be connected to system load 330 for powering system load 330 and/or discharging battery 322. Battery protection circuit 323 may, for example, monitor charging, discharging, temperature, and/or other parameters of battery 322 to ensure safe and effective operation of battery 322. Battery protection circuit 323 may be connected to switch 326, which may be used to connect battery 322 to system load 330 or disconnect battery 322 from system load 330. For example, when switch 326 is closed, charging and/or discharging (e.g., to power system load 330) of battery 322 may be permitted. When switch 326 is open, charging and/or discharging of battery 322 may be inhibited. As described above, switch 326 may include, for example, a power relay or another electrical, electromagnetic, or electromechanical switch that can be switched on or off using an electrical control signal.

Hall-effect sensor 324 may be configured to detect the presence or a change (e.g., more than a threshold magnitude) of a magnetic field adjacent housing 321 of electronic device 320. As illustrated, Hall-effect sensor 324 may not be powered by battery 322, but may be connected to wireless charge receiver 334 to be powered by the wireless charging power received by coil 332 from auxiliary device 340. Therefore, during normal use or when electronic device 320 is otherwise not charged, Hall-effect sensor 324 would not be functional. As such, when the electronic device 320 is not charged, even if there are stray magnetic fields, Hall-effect sensor 324 may not be operational and may not be susceptible to the magnetic fields to trigger accidental, unintentional, or other inadvertent shutdown/reset of electronic device 320. Other suitable magnetic, electrical, or electromagnetic sensors may also be used, such as, for example, a magnetoresistive position sensor, a fluxgate sensor, a superconducting quantum interference device (SQUID), a resonant sensor, an induction magnetometer, a linear variable differential transformer, an Eddy current sensor, a variable reluctance sensor, a magnetic encoder, a permanent magnet linear contactless displacement sensor, and the like.

Reset/shutdown timer circuit 325 may be connected to Hall-effect sensor 324 such that when Hall-effect sensor 324 detects the presence or change of a magnetic field, a signal is provided from Hall-effect sensor 324 to reset/shutdown timer circuit 325 to initiate a shutdown and/or reset timer. As with Hall-effect sensor 324, reset/shutdown timer circuit 325 may not be powered by battery 322, but may instead be connected to wireless charge receiver 334 to be powered by the wireless charging power from auxiliary device 340 through coil 332. Therefore, during normal operation of electronic device 320 or when electronic device 320 is otherwise not charged, reset/shutdown timer circuit 325 would not be functional and would not shut down or reset electronic device 320, thereby avoiding accidental, unintentional, or other inadvertent shutdown/reset of electronic device 320. Reset/shutdown timer circuit 325 may be connected to battery protection circuit 323 such that, at the expiration of the shutdown and/or reset timer, a signal may be provided by reset/shutdown timer circuit 325 to battery protection circuit 323, so that battery protection circuit 323 may provide a control signal to switch 326 to change the state of switch 326 from a closed state to an open state, thereby disconnecting battery 322 and inhibiting charge and discharge of battery 322 to power down electronic device 320. In some embodiments, reset/shutdown timer circuit 325 may not be used, and Hall-effect sensor 324 may be directly connected to battery protection circuit 323 or switch 326 to provide the control signal for switching switch 326. In some embodiments, battery protection circuit 323 may be powered by, for example, battery 322.

The wireless charging antenna (e.g., coil 332) may be configured to receive wireless charging power from auxiliary device 340 when electronic device 320 is close to and is aligned with auxiliary device 340. As described above, the wireless charging may be based on industry standards such as Qi or proprietary wireless charging technology. Wireless charge receiver 334 may be powered by coil 332, and may send the power received from coil 332 to, for example, Hall-effect sensor 324, reset/shutdown timer circuit 325, and charge manager circuit 336. Since reset/shutdown timer circuit 325 and Hall-effect sensor 324 can be powered by wireless charge receiver 334 using power received by coil 332, these components may not depend on power from battery 322, and thus may be independent therefrom and may continue to operate even if battery 322 is disconnected. Reset/shutdown timer circuit 325 and Hall-effect sensor 324 may be relatively easy to implement and may only minimally increase the complexity and cost of electronic device 320.

Charge manager circuit 336 may control the powering of system load 330, for example, using battery 322 and/or power received from wireless charge receiver 334. In some embodiments, charge manager circuit 336 may also manage the charging of battery 322 using power received from wireless charge receiver 334 and coil 332. Charge manager circuit 336 may be powered by battery 322 and/or power received from wireless charge receiver 334.

Auxiliary device 340 may include a body 341 and included thereon or therein: a wireless control signal transmitter (e.g., an example of non-contact signal transmitter 144), which may be in the form of an electromagnetic coil 344; one or more user interfaces which may be in the form of one or more buttons 348 and 349 (and the underlying switches); an output interface including, for example, one or more LEDs 350; a wireless power signal transmitting coil 352; a wireless charge transmitter circuit 354; one or more switches 342 and 346; an MCU 356; a voltage regulator circuit 358; an input port 360 (e.g., a USB port); or a combination thereof.

Input port 360 may be configured to connect auxiliary device 340 to a power source, such as, for example, a standard wall output and/or associated adapter (not shown), using a USB cable (not shown). In some embodiments, input port 360 may also receive data, instructions, or other inputs from an external device through, for example, a connection cable. Power received at input port 360 may be fed to voltage regulator circuit 358, which may regulate input power signals received at input port 360 and generate a DC voltage signal at an appropriate voltage level, such as the operating voltage of MCU 356 (e.g., 5V, 3.3 V, 1.8 V, 1.2 V, etc.). The output of voltage regulator circuit 358 may be connected to MCU 356 to power MCU 356.

Input port 360 may also be connected to wireless charge transmitter circuit 354, optionally through switch 342, to provide power to wireless power signal transmitting coil 352 for transmitting to electronic device 320. Switch 342, when present, may be controlled by MCU 356 and may be used to enable or disable the powering of wireless charge transmitter circuit 354 and thus the transmitting of wireless power signals by wireless power signal transmitting coil 352. In some embodiments, input port 360 may further be connected to electromagnetic coil 344, optionally through switch 346, to provide power to electromagnetic coil 344. Switch 346, when present, may be controlled by MCU 356 and may be used to enable or disable the powering of electromagnetic coil 344 and thus the transmitting of wireless control signals by electromagnetic coil 344 to the non-contact sensor (e.g., Hall-effect sensor 324) of electronic device 320.

MCU 356 may be the main controller of auxiliary device 340. As described above, MCU 356 may be connected to switches 342 and 346 to control the opening and closing of switches 342 and 346. As illustrated, MCU 356 may also be connected to wireless charge transmitter circuit 354 to control wireless power transmission from auxiliary device 340 to electronic device 320. MCU 356 may further be connected to the one or more buttons 348 and 349 or other input user interfaces for receiving user inputs. MCU 356 may additionally be connected to one or more LEDs 350 or other output user interfaces for outputting information such as status of various devices and signaling to users. For example, MCU 356 may control the one or more LEDs 350 to emit light in particular colors, lighting patterns (e.g., steady or flashing at various frequencies), or various combinations of colors and/or lighting patterns, in order to convey status information such as, for example, charging in progress, charge complete, no device present, shutdown in progress, shutdown complete, reset in progress, reset complete, error occurred, and the like.

Actuation of the one or more buttons 348 and 349 in a particular combination, pattern, and the like, may signal MCU 356 to, for example, initiate wireless charging, stop wireless charging, initiate the transmission of a hardware shutdown signal, initiate the transmission of a hardware reset signal, and the like. For example, the user may press one button 348 to request a hardware shutdown of electronic device 320, and may press another button 349 to request a hardware reset of electronic device 320. In another example, one button 348 may be pressed and held for a first duration to initiate a hardware shutdown of electronic device 320 and may be pressed and held for a second duration to initiate a hardware reset of electronic device 320. When the user performs a particular actuation or a particular combination of actuations of the one or more buttons 348 and 349, MCU 356 may determine the user request and provide a signal to close switch 346, thereby enabling the supply of power to electromagnetic coil 344. When electromagnetic coil 344 is powered, a current may be supplied to electromagnetic coil 344 to generate a magnetic field of a sufficiently high magnitude, which may be detectable by Hall-effect sensor 324 of electronic device 320.

In some embodiments, electromagnetic coil 344 may be powered for different durations or using different current amplitudes, such that signals transmitted by electromagnetic coil 344 may have different magnitudes, different durations, different repeating patterns, or a combination, to indicate different user requests (e.g., shutdown request and reset request) to electronic device 320. In some embodiments, the signal transmitted by electromagnetic coil 344 may be the same for both shutdown and reset, and MCU 356 may determine whether or not to re-initiate charging after the shutdown based upon whether a shutdown or reset request is received from the actuation (e.g., press and hold) of the one or more buttons 348 and 349. For example, if MCU 356 determines that the user requests a shutdown, MCU 356 may disable the transmission of wireless power signals to electronic device 320. On the other hand, if MCU 356 determines that the user requests a reset, MCU 356 may maintain or re-initiate the transmission of wireless power signals to electronic device 320 after the shutdown of electronic device 320 such that electronic device 320 may be restarted. Transmitting the same wireless control signal to electronic device 320 for both hardware reset and shutdown and using auxiliary device 340 to perform additional options that may be different for hardware reset and shutdown may help to reduce the complexity and cost of electronic device 320.

In some embodiments, electromagnetic coil 344, wireless power signal transmitting coil 352, Hall-effect sensor 324, and coil 332 may be relatively positioned in auxiliary device 340 and electronic device 320 such that, when electronic device 320 is properly placed on or engaged with auxiliary device 340, or is properly placed in a position in close proximity to auxiliary device 340, wireless power signal transmitting coil 352 and coil 332 may be approximated and aligned, and electromagnetic coil 344 and Hall-effect sensor 324 may also be approximated and aligned. In some embodiments, body 341 and/or housing 321 may include alignment features to facilitate the desired alignment and approximation when electronic device 320 is placed on or engaged with auxiliary device 340. For example, in some embodiments, body 341 and housing 321 may have complementary shapes or matching features, such that electronic device 320 and auxiliary device 340 can be mated and coupled together in a particular manner to ensure the desired alignment and proximity. In one example described in detail below, electronic device 320 may be a durable or reusable portion of a wearable medical device (e.g., an infusion pump), while auxiliary device 340 may have the same shape as a disposable portion (e.g., the portion that includes a therapeutic fluid reservoir that can be replaced) of the wearable medical device that is mated with the durable or reusable portion in the wearable medical device. In this way, electronic device 320 and auxiliary device 340 may only be coupled in a unique way to ensure the desired alignment and approximation described above.

Figure 4:
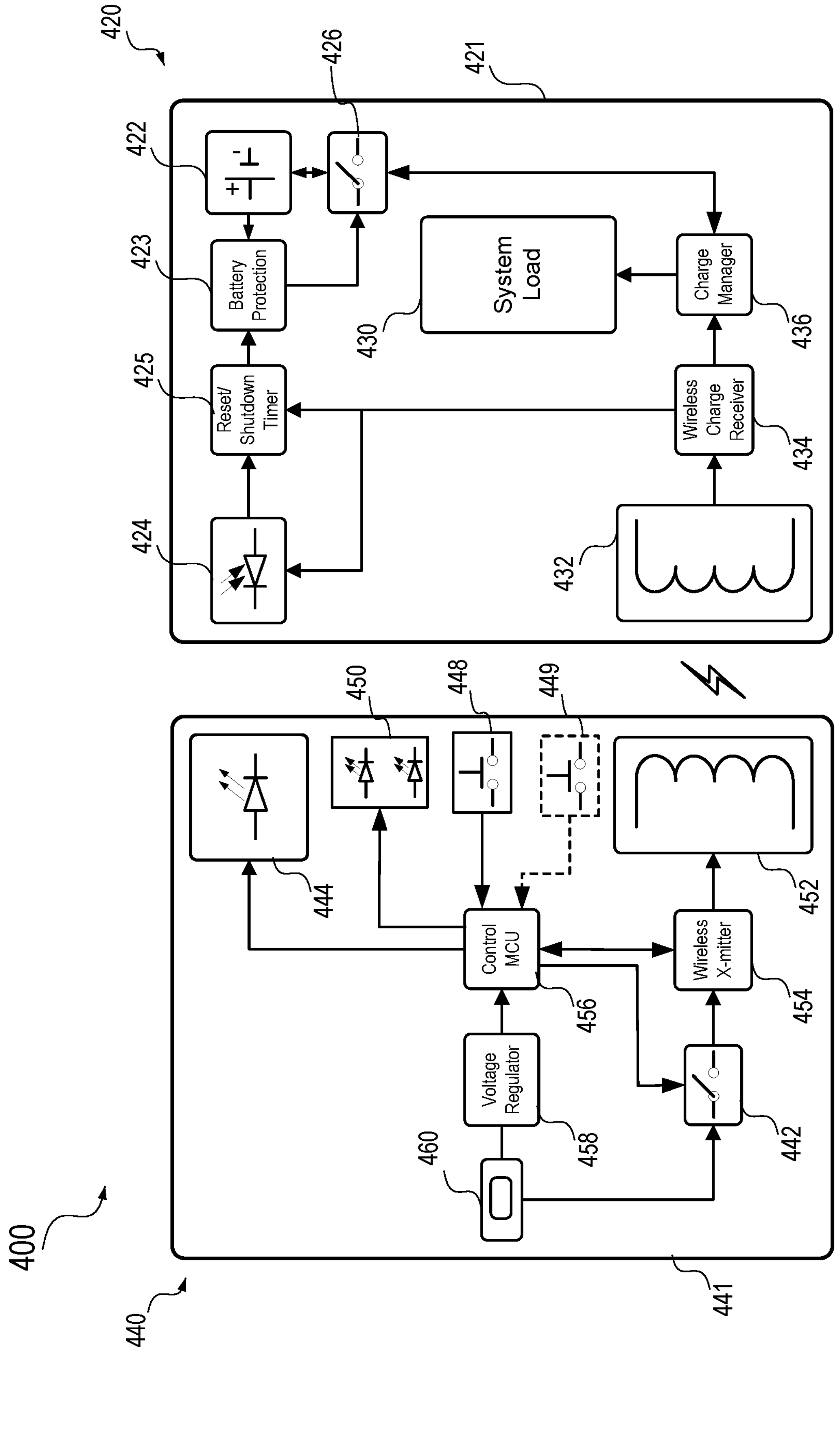
FIG. 4 illustrates another example of a system including an electronic device and an auxiliary device enabling non-contact hardware shutdown and/or reset of the electronic device according to certain embodiments.

FIG. 4 illustrates another example of a system 400 including an electronic device 420 and an auxiliary device 440 enabling non-contact hardware shutdown and/or reset of electronic device 420 according to certain embodiments. System 400 may be similar to system 300 and may include many features and components similar to or same as corresponding features and components of system 300 of FIG. 3 and system 100 of FIG. 1. Thus, only differences between system 400 and system 300 are described in detail hereinbelow while similarities are summarily described or omitted entirely.

In the illustrated example, electronic device 420 may include a housing 421 and, enclosed therein: a battery assembly including a battery 422 having one or more battery cells, and a battery protection circuit 423; a non-contact sensor such as, for example, an infrared (IR) receiver 424; a reset/shutdown timer circuit 425; a switch 426; a system load 430; a wireless charging antenna (e.g., a coil 432); a wireless charge receiver 434; a charge manager circuit 436; or a combination thereof. Electronic device 420 may be similar to electronic device 320 of FIG. 3, but may include a non-contact sensor that is in the form of IR receiver 424 (e.g., including an infrared photodetector and a demodulator), rather than a Hall-effect sensor. Other components and features of electronic device 420 may be similar to or same as other components and features of electronic device 320. As Hall-effect sensor 324, IR receiver 424 are not powered by a battery (e.g., battery 422), and thus would not be functional during normal operation of electronic device 420 or when electronic device 420 is otherwise not charged. As such, during normal operation of electronic device 420 (not charged), even if there is stray IR light, IR receiver 424 may not be operational and may not be susceptible to the IR light to trigger accidental, unintentional, or other inadvertent shutdown/reset of electronic device 420. Similarly, reset/shutdown timer circuit 425 may not be powered by battery 422, but may instead be connected to wireless charge receiver 434 to be powered by the wireless charging power. Therefore, during normal operation of electronic device 420 or when electronic device 420 is otherwise not charged, reset/shutdown timer circuit 425 would not be functional and would not shut down or reset electronic device 420, thereby avoiding accidental, unintentional, or other inadvertent shutdown/reset of electronic device 420.

Auxiliary device 440 may include a body 441 and, included thereon or therein: one or more switches 442; a wireless signal transmitter which may include an IR emitter 444; one or more user interfaces which may include one or more buttons 448 and 449 (and the underlying switches); an output interface including, for example, one or more LEDs 450; a wireless power signal transmitting coil 452; a wireless charge transmitter circuit 454; an MCU 456; a voltage regulator circuit 458; an input port 460 (e.g., a USB port); or a combination thereof. Auxiliary device 440 may be similar to auxiliary device 340 of FIG. 3, but may include a wireless signal transmitter that includes IR emitter 444 (rather than electromagnetic coil 344). IR emitter 444 may be controlled and powered by MCU 456, and thus there may not be connection from input port 460 to IR emitter 444 through a switch (e.g., switch 346).

In system 400, when the user performs a particular actuation or a particular combination of actuations of the one or more buttons 448 and 449, MCU 456 may determine the user request and control IR emitter 444 to emit an IR optical signal. In some embodiments, the IR optical signal may have a particular intensity, wavelength, duration, pulse rate, or a combination thereof, to initiate a hardware shutdown of electronic device 420. In some embodiments, the IR optical signal may vary in, for example, intensity, wavelength, duration, pulsing rate, and the like, in order to provide different wireless control signals (e.g., for hardware shutdown and hardware reset) to electronic device 420. IR receiver 424 may be configured to receive and demodulate the IR optical signals to determine the user request, and provide a signal to reset/shutdown timer circuit 425 to initiate a shutdown timer and/or a reset timer. Reset/shutdown timer circuit 425 may open switch 426 to disconnect battery 422 after the shutdown timer expires. In some embodiments, when a reset of electronic device 420 is requested, reset/shutdown timer circuit 425 may close switch 426 to reconnect battery 422 after the reset timer expires.

Figure 5:
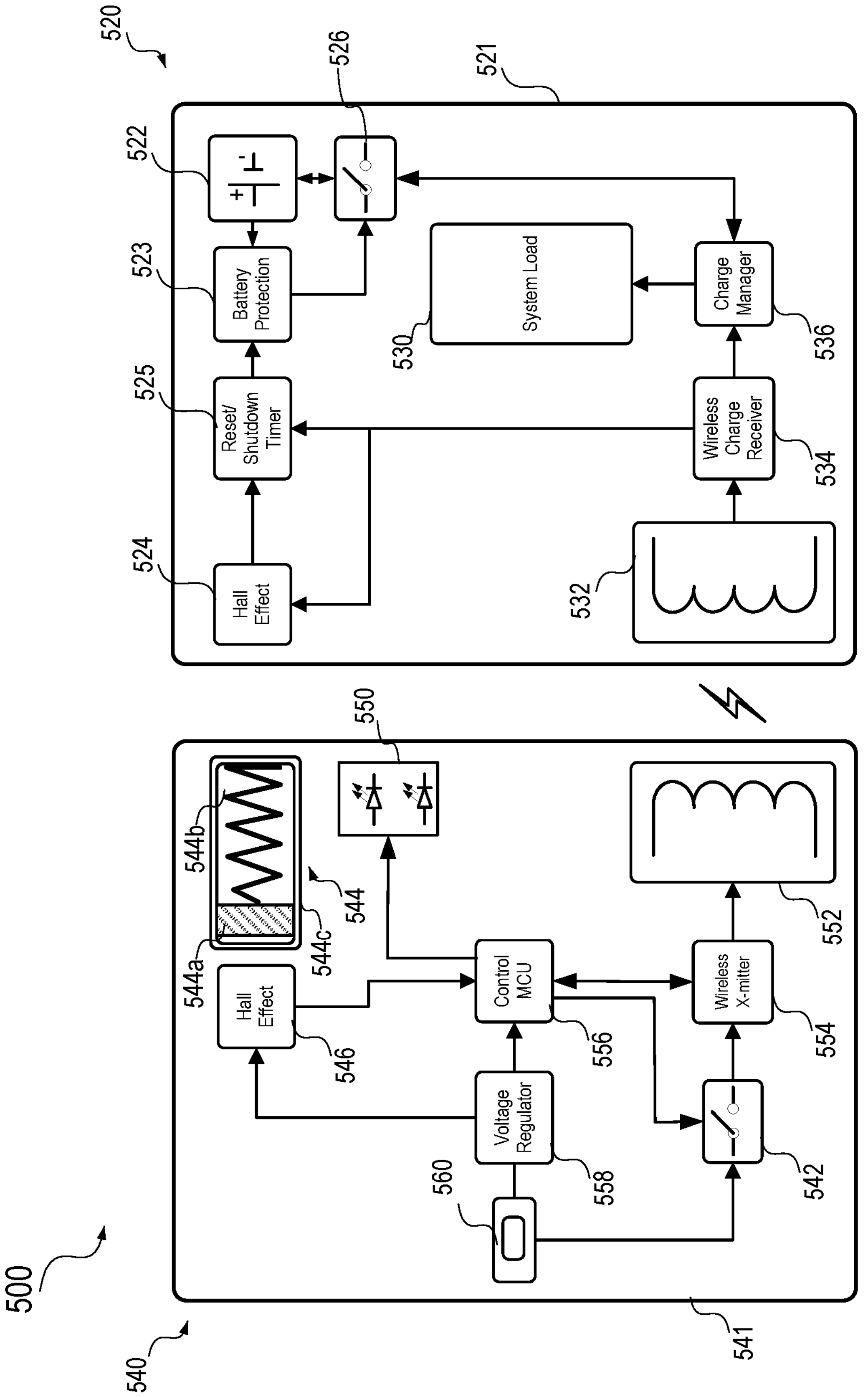
FIG. 5 illustrates yet another example of a system including an electronic device and an auxiliary device enabling non-contact hardware shutdown and/or reset of the electronic device according to certain embodiments.

FIG. 5 illustrates another example of a system 500 including an electronic device 520 and an auxiliary device 540 enabling non-contact hardware shutdown and/or reset of electronic device 520 according to certain embodiments. System 500 may be similar to system 300 or 400, and may include many features and components similar to or same as corresponding features and components of system 100 of FIG. 1, system 300 of FIG. 3, and system 400 of FIG. 4. Thus, only differences between system 500 and system 300 are described in detail hereinbelow while similarities are summarily described or omitted entirely.

In the illustrated example, electronic device 520 may include a housing 521 and, enclosed therein: a battery assembly including a battery 522 having one or more battery cells, and a battery protection circuit 523; a non-contact sensor such as, for example, Hall-effect sensor 524; a reset/shutdown timer circuit 525; a switch 526; a system load 530; a wireless charging antenna (e.g., a coil 532); a wireless charge receiver 534; a charge manager circuit 536, or a combination thereof. Electronic device 520 may be similar to or same as electronic device 320 of FIG. 3, except that the non-contact sensor (e.g., Hall-effect sensor 524) may detect and determine the user request in a different manner as detailed below. As in electronic device 320, Hall-effect sensor 524 and reset/shutdown timer circuit 525 are not powered by a battery (e.g., battery 522), and thus would not be functional during normal operation of electronic device 520 or when electronic device 520 is otherwise not charged. As such, during normal operation of electronic device 520 (not charged), even if there are stray magnetic fields, Hall-effect sensor 524 and reset/shutdown timer circuit 525 may not be operational and may not be susceptible to the magnetic field to accidentally, unintentionally, or other inadvertently shut down/reset electronic device 520.

Auxiliary device 540 may include a body 541 and, included thereon or therein: one or more switches 542; a signal output device in the form of a slidable magnet 544; a Hall-effect sensor 546; an output user interface including, for example, one or more LEDs 550; a wireless power signal transmitting coil 552; a wireless charge transmitter circuit 554; an MCU 556; a voltage regulator circuit 558; an input port 560 (e.g., a USB port); or a combination thereof. Auxiliary device 540 may be similar to auxiliary device 340 of FIG. 3 or auxiliary device 440 of FIG. 4. But Auxiliary device 540 may include a slidable magnet 544 as both the wireless control signal transmitter (rather than electromagnetic coil 344 or IR emitter 444) and part of the input user interface (rather than one or more buttons 348 and 349); and a Hall-effect sensor 546 as part of the input user interface. Slidable magnet 544 may include a magnet 544*a* (e.g., a permanent magnet) that may be slid along a track 544*c*, and one or more springs 544*b* that may constraint the position of magnet 544*a*. For example, the one or more springs 544*b* may bias magnet 544*a* at an un-actuated position (e.g., at the left end, center, or right end of slidable magnet 544) when magnet 544*a* is not slid by the user. Magnet 544*a* can be manually slid along track 544*c* to different positions by a user to request a shutdown or reset of electronic device 520. In some embodiments, an external slide knob, button, and the like (not shown) may be provided, to facilitate user manipulation of slidable magnet 544.

Movement of magnet 544*a* from one position (e.g., an un-actuated position at the left end of track 544*c*) towards another position (e.g., an actuated position at the right end of track 544*c*) may change the magnetic field in the surrounding area. The change of the magnetic field may be detected by Hall-effect sensor 524 of electronic device 520 to initiate a shutdown or reset of electronic device. In some embodiments, the number of movements of magnet 544*a* between the un-actuated position and the actuated position, and/or the duration that magnet 544*a* is maintained in the actuated position may be used to indicate a specific user request (e.g., hardware shutdown or request), and may be detected by Hall-effect sensor 524 to initiate a hardware shutdown or reset of electronic device 520. For example, sliding magnet 544*a* from the un-actuated position to the actuated position fewer times (e.g., one or two times) or holding magnet 544*a* at the actuated position for a shorter time period (e.g., 5 seconds or shorter) may indicate a user request for the shutdown of electronic device 520, while sliding magnet 544*a* from the un-actuated position to the actuated position more times (e.g., two or more times) or holding magnet 544*a* at the actuated position for a longer time period (e.g., 10 seconds or longer) may indicate a user request for a reset of electronic device 520. In some embodiments, Hall-effect sensor 546 of auxiliary device 540 may also detect the sliding of magnet 544*a*, and may provide signals to MCU 556 to indicating the user request, such that MCU 556 may respond accordingly. For example, MCU 556 may, based on the user request, open or close switch 542 to enable or disable wireless charging, or control one or more LEDs 550 to emit light in particular colors, lighting patterns, or combinations of colors and/or lighting patterns, to convey certain status information (e.g., charging, charge complete, no device present, shutdown in progress, shutdown complete, reset in progress, reset complete, error occurred, etc.) to the user.

Figure 6A:
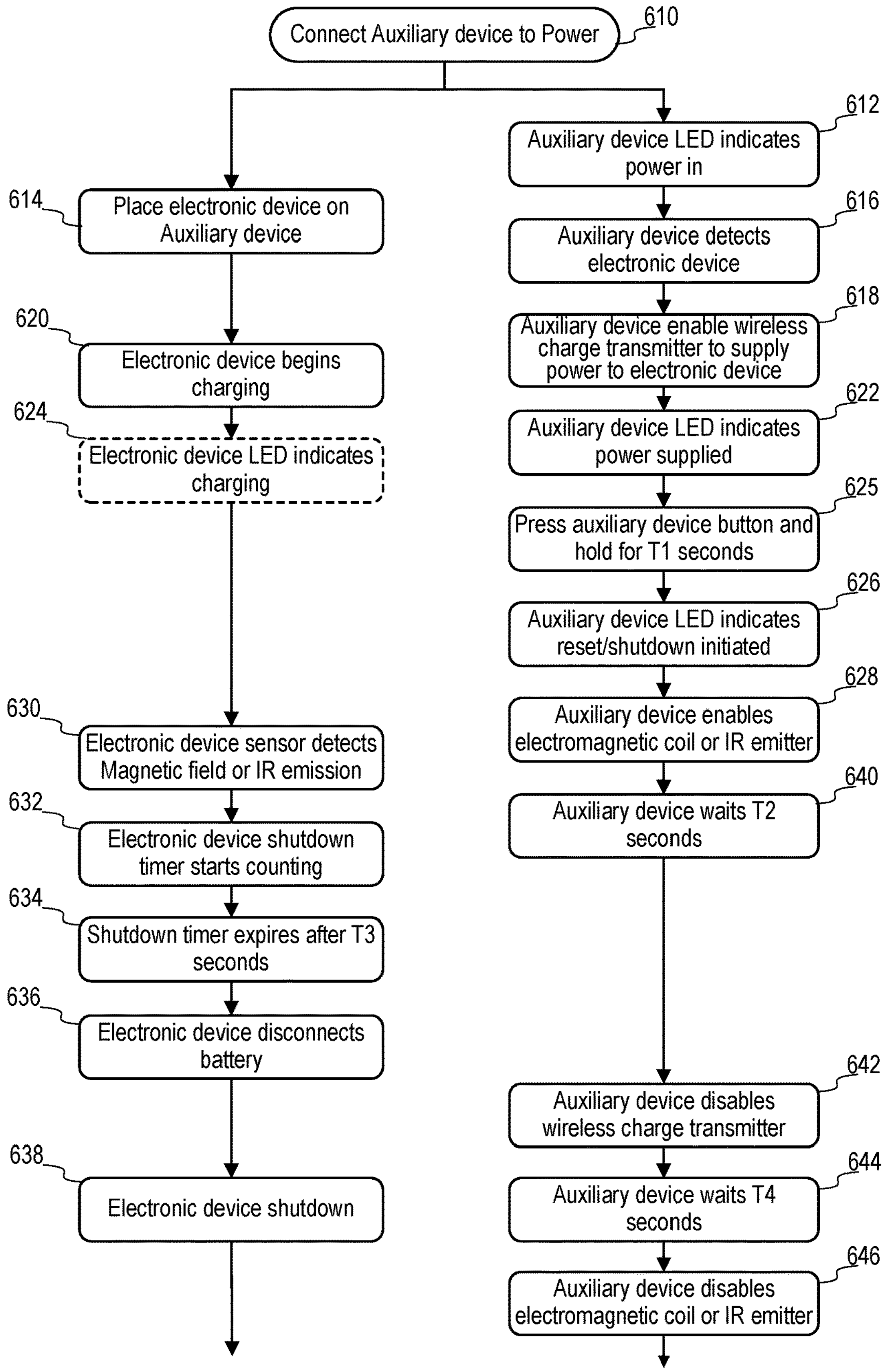
FIGS. 6A-6C include flow diagrams illustrating examples of non-contact hardware shutdown and/or reset processes according to certain embodiments.
Figure 6B:
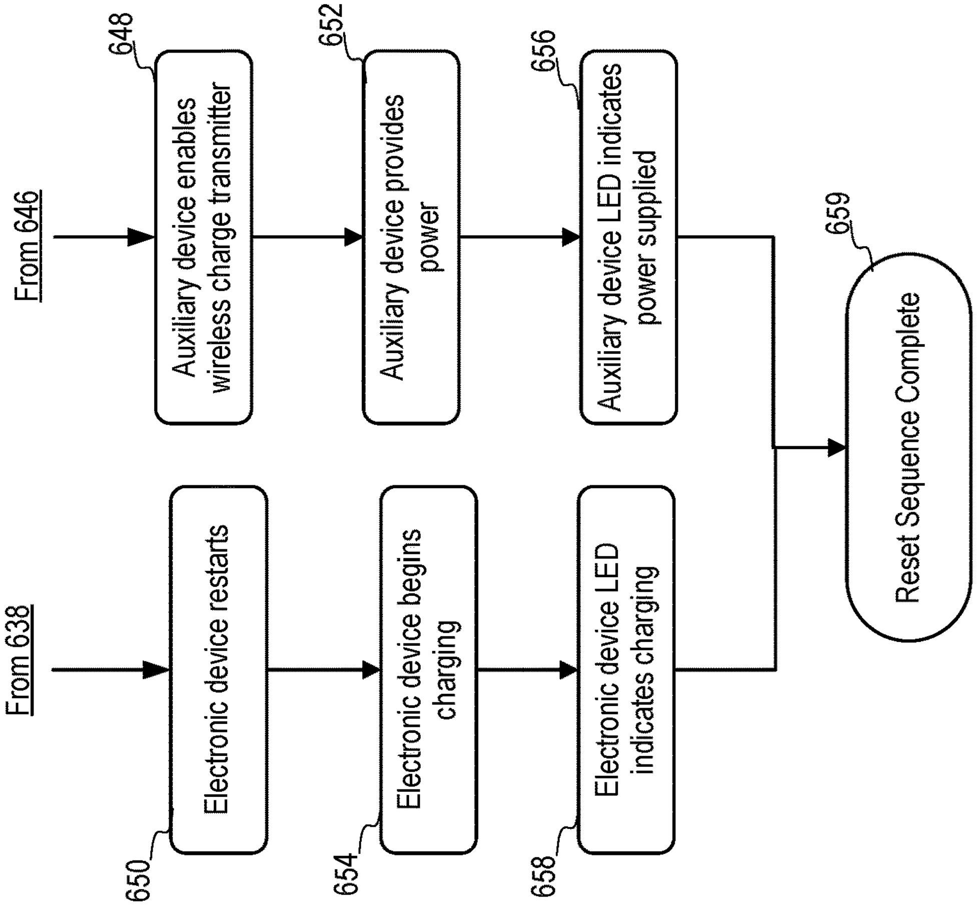
Figure 6C:
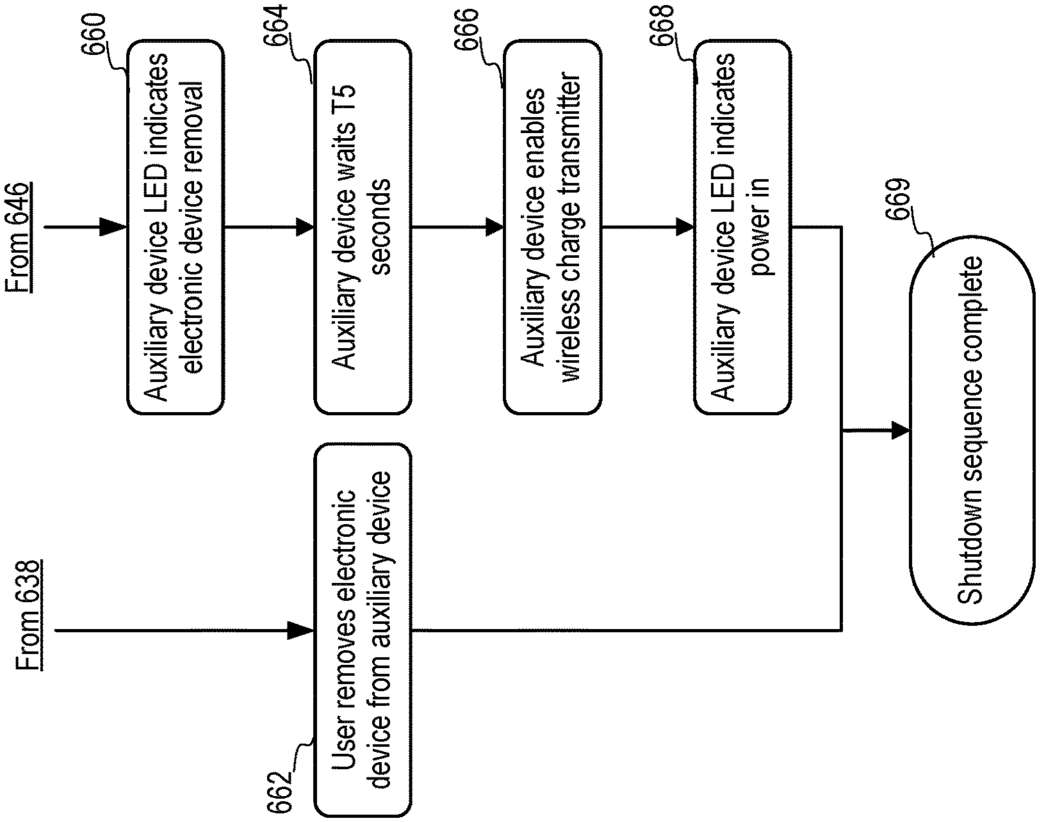

FIGS. 6A-6C include flow diagrams illustrating examples of non-contact hardware shutdown and/or reset processes according to certain embodiments. For example, the flow diagrams in FIGS. 6A and 6B illustrate an example of a non-contact hardware reset process according to certain embodiments, while the flow diagrams in FIGS. 6A and 6C illustrate an example of a non-contact hardware shutdown process according to certain embodiments. The processes shown in FIGS. 6A-6C may be implemented using system 100, 300, or 400 as shown in FIGS. 1, 3, and 4, or any other suitable devices or systems. The processes illustrated in FIGS. 6A-6C are for illustration purposes only, and are not intended to limit the non-contact hardware shutdown and/or reset processes disclosed herein to the specific examples shown in FIGS. 6A-6C. Other suitable sequences may be implemented using system 100, 300, or 400. For example, some operations of the flow diagrams may be omitted or reordered, and/or some operations may be added to the flow. In each of FIGS. 6A-6C, the left side flow may include operations performed by or on, for example, electronic device 120, 320, or 420, while the right side flow may include operations performed by or on an auxiliary device, such as auxiliary device 140, 340, or 440. In some embodiments, operations in FIGS. 6A-6C may be performed by the electronic device and the auxiliary device from top to bottom in chronological order, and FIGS. 6A-6C may use the same relative chronological scale to show temporal relationships between certain operations of the electronic device and certain operations of the auxiliary device.

At block 610, the auxiliary device disclosed herein (e.g., auxiliary device 140, 340, or 440) may be connected to a suitable power source. For example, a USB cable may be plugged into the input port (e.g., input port 148, 360, or 460) of the auxiliary device. After the auxiliary device is connected to the power source, the auxiliary device may be initialized and may provide an indication of its status, such as powered on but no device present, via, for example, the illumination of a particular combination of the number, color, and/or pattern of LED(s), at block 612. In one example, the auxiliary device may cause a green LED to blink to indicate that the auxiliary device is powered on and is ready for charging an electronic device. At block 614, an electronic device with a rechargeable battery may be placed on the auxiliary device. As described above, the electronic device may be aligned with the auxiliary device, for example, by mating matching (e.g., complementary) features of the electronic device and the auxiliary device, docking the electronic device to a docking socket of the auxiliary device, or using other alignment features when placing the electronic device on or near the auxiliary device.

At block 616, the auxiliary device may detect the presence of the electronic device, for example, using a Hall-effect sensor or based on a change in the load (e.g., inductive or capacitive loading) of the auxiliary device. After detecting the presence of the electronic device, the auxiliary device may begin to charge the electronic device at block 618, for example, by transmitting wireless power signals using a coil. At block 620, the wireless charge receiving antenna (e.g., a coil) and the wireless charge receiver of the electronic device may receive the wireless power signal and send the received power to a charge manager circuit (e.g., charge manager circuit 336 or 436) to charge a rechargeable battery (e.g., battery 322 or 422) of the electronic device. At block 622, after the electronic device begins to be charged, the auxiliary device may provide an indication of its status and indicate that the auxiliary device is transmitting wireless power signals to charge the electronic device (charging in progress), for example, via the illumination of a particular number, color, and/or pattern of LEDs (e.g., steady green light). Optionally, at block 624, the electronic device may provide an indication of its status and indicate that the electronic device is being charged, for example, via the illumination of a particular number, color, and/or pattern of LEDs (e.g., blinking green light).

At block 625, while the auxiliary device is charging the electronic device, the user may provide an input to the auxiliary device to initiate a hardware shutdown or reset, for example, by actuating one or more buttons of the auxiliary device in a particular pattern and/or for a particular duration to initiate a hardware shutdown or reset. As described above, in some embodiments, the user may press and hold a button for a certain time period T1 to initiate a hardware shutdown or reset. In one example, the user may press and hold a first button for one or more seconds to initiate a hardware shutdown, and may press and hold a second button for one or more seconds to initiate a hardware reset. In another example, the user may press and hold a button for no more than 5 (e.g., about 5) seconds to initiate a hardware shutdown, and may press and hold the same button for 5 or more (e.g., about 10) seconds to initiate a hardware reset. The user input may be recognized by the MCU (or other suitable controller) of the auxiliary device, which may control the output user interface of the auxiliary device to generate a corresponding status indication (e.g., reset or shutdown initiated) via the illumination of a particular number, color, and/or pattern of LEDs (e.g., blinking yellow light) at block 626. Before, concurrently with, or after the operation at block 626, the auxiliary device may generate a non-contact hardware shutdown or reset control signal using, for example, electromagnetic coil 344 or IR emitter 444, at block 628, and then wait for a certain time period T2 (e.g., about 20 seconds) at block 640.

At block 630, the non-contact hardware shutdown or reset control signal may be detected by a non-contact sensor of the electronic device, such as a Hall-effect sensor (e.g., Hall-effect sensor 324) or an IR receiver (e.g., IR receiver 424). Upon detection of the non-contact hardware shutdown or reset control signal, the electronic device may start a hardware shutdown process at block 632. As described above, the electronic device may disconnect a battery from the system load of the electronic device immediately or after a certain time delay. For example, the electronic device may start a reset/shutdown timer to wait for a time period T3 (e.g., longer than 5 or 10 seconds, such as about 12.5 seconds) that is shorter than time period T2 (e.g., about 20 seconds). After the reset/shutdown timer expires after time period T3 at block 634, the electronic device may disconnect the battery from the system load using a switch to shut down the electronic device at block 636 as described above with respect to FIGS. 1-4, and may remain shut down at block 638. As described above, the non-contact sensor, the reset/shutdown timer, and the switch may be powered by the wireless charging power, rather than the battery, and thus may continue to operation after the battery is disconnected and the rest of the electronic device is shut down.

After waiting for time period T2 (e.g., about 20 seconds) at block 640, the auxiliary device may disable its wireless charge transmitter at 642. As such, electronic device may not be charged and may not be powered by the wireless charging power or the battery. In some embodiments, after disabling the wireless charge transmitter, the auxiliary device may wait for a time period T4 (e.g., about 10 seconds) at block 644 and then disable the electromagnetic coil or the IR transmitter at block 646. In some embodiments, the auxiliary device may disable the electromagnetic sensor or the IR transmitter before, currently with, or after disabling the wireless charge transmitter at block 642.

As shown in FIG. 6B, if the user initiated a hardware reset at block 625, the auxiliary device may then re-enable its wireless charge transmitter at block 648 and start to provide power to the electronic device, such that the electronic device may restart at block 650 using the power received from the auxiliary device and/or the power from the battery, for example, after the battery is reconnected through the switch and/or a charge manager circuit. The auxiliary device may continue to provide power to the electronic device at block 652, and the battery reconnected to the charge manager circuit may begin charging at block 654. During the charging of the electronic device, the auxiliary device may provide a suitable status indicator (e.g., steady green light) at block 656, and, optionally, the electronic device may provide a suitable status indicator (e.g., blinking green light) at block 658. The reset sequence may complete at block 659 when the auxiliary device and the electronic device are in the steady charging state.

As shown in FIG. 6C, if the user initiated a hardware shutdown at block 625, the auxiliary device may, after the operations at blocks 642-646, provide a status indicator (e.g., steady or blinking light of a certain color or combination of colors) at block 660 to indicate that the electronic device is shut down and is not charging, such that it can be safely removed. The status indicator may signal the user to remove the electronic device from the auxiliary device at block 662 to complete the shutdown sequence at block 669. In some embodiments, after providing the status indicator, the auxiliary device may wait for a time period T5 (e.g., about 30 seconds) at block 664, to give user sufficient time to remove the electronic device. After waiting for time period T5, the auxiliary device may re-enable its wireless charge transmitter at block 666 and may provide a status indicator at block 668 to indicate that the auxiliary device is ready to charge a device.

Figure 7A:
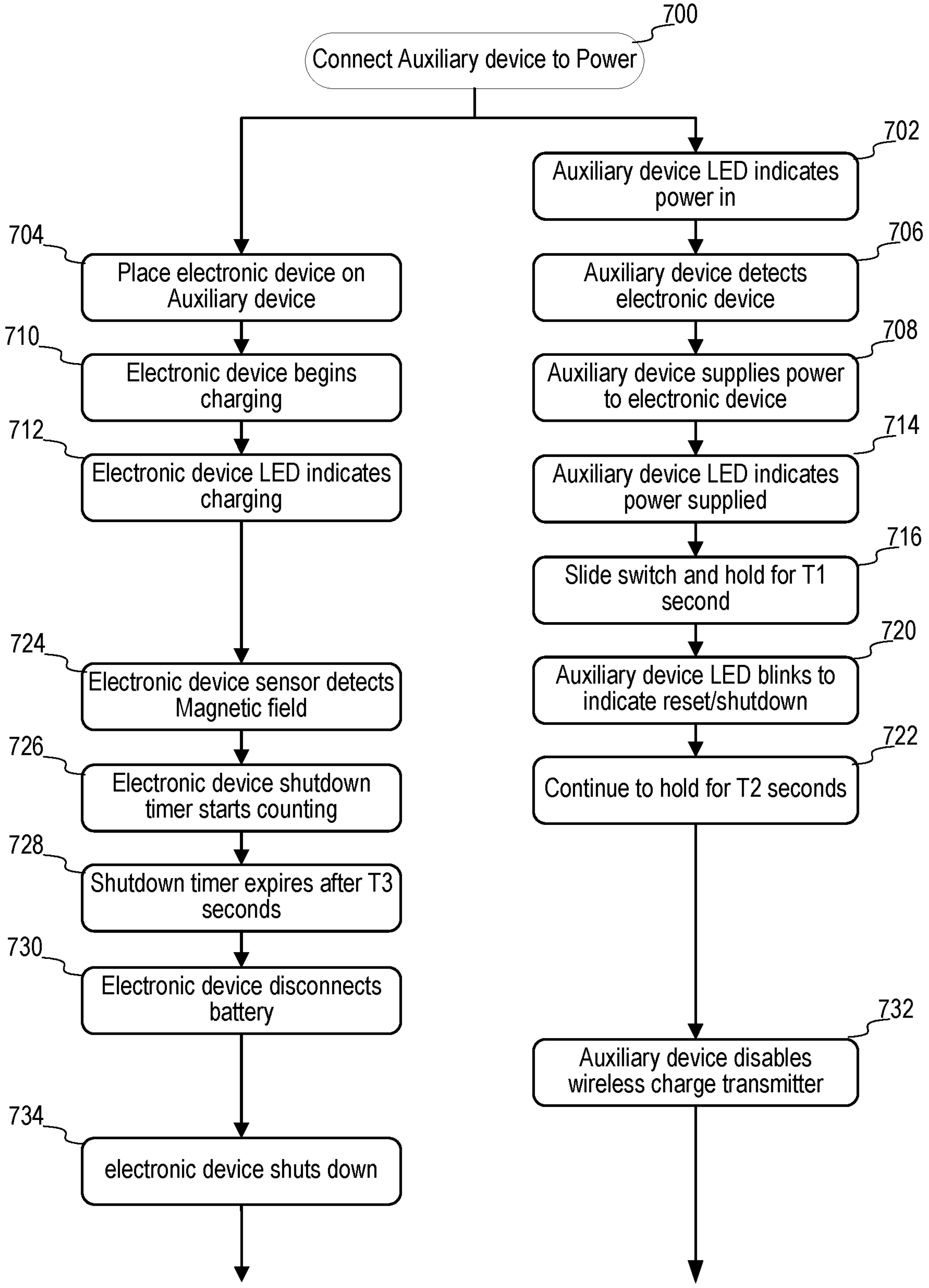
FIGS. 7A-7C include flow diagrams illustrating examples of non-contact hardware shutdown and/or reset processes according to certain embodiments.
Figure 7B:
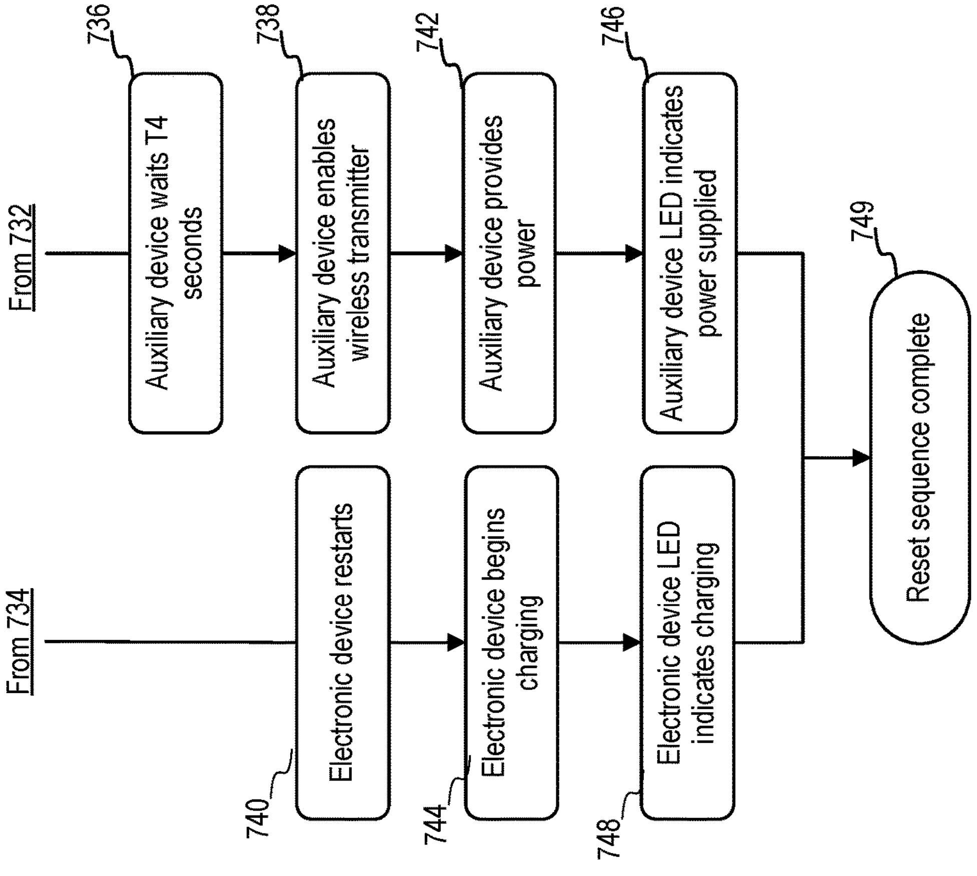
Figure 7C:
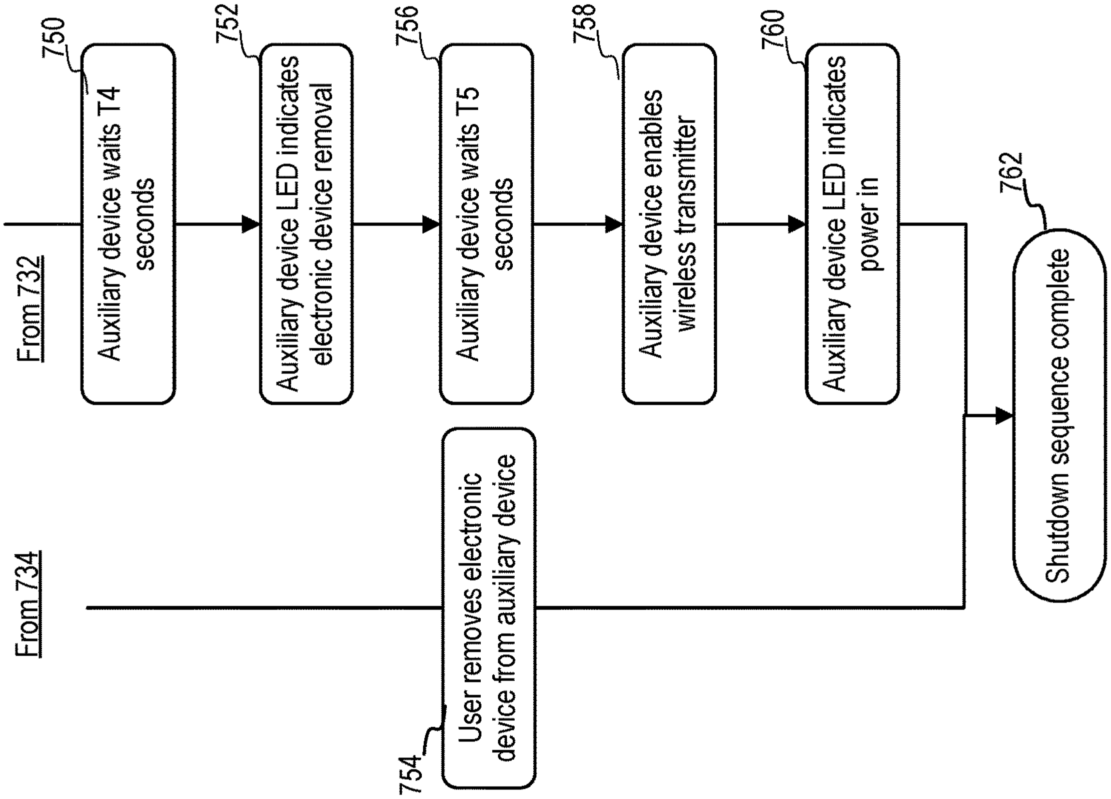

FIGS. 7A-7C include flow diagrams illustrating examples of non-contact hardware shutdown and/or reset processes according to certain embodiments. For example, the flow diagrams in FIGS. 7A and 7B illustrate an example of a non-contact hardware reset process according to certain embodiments, while the flow diagrams in FIGS. 7A and 7C illustrate an example of a non-contact hardware shutdown process according to certain embodiments. The processes shown in FIGS. 7A-7C may be implemented using, for example, system 500 as shown in FIG. 5, or any other suitable devices or systems. The processes illustrated in FIGS. 7A-7C are for illustration purposes only, and are not intended to limited the non-contact hardware shutdown and/or reset processes disclosed herein to the specific examples shown in FIGS. 7A-7C. Other suitable sequences may be implemented using system 500. For example, some operations of the flow diagrams may be omitted or reordered, and/or some operations may be added to the flow. In each of FIGS. 7A-7C, the left side flow may include operations performed by or on, for example, electronic device 520, while the right side flow may include operations performed by or on an auxiliary device, such as auxiliary device 540. In some embodiments, operations in FIGS. 7A-7C may be performed by the electronic device and the auxiliary device from top to bottom in chronological order, and FIGS. 7A-7C may use the same relative chronological scale to show temporal relationships between certain operations of the electronic device and certain operations of the auxiliary device.

At block 700, the auxiliary device (e.g., auxiliary device 540) may be connected to a suitable power source. For example, a USB cable may be plugged into the input port (e.g., input port 560) of the auxiliary device. After the auxiliary device is connected to the power source, the auxiliary device may be initialized and may provide an indication of its status, such as powered on but no device present, via, for example, the illumination of a particular combination of the number, color, and/or pattern of LED(s), at block 702. In one example, the auxiliary device may cause a green LED to blink to indicate that the auxiliary device is powered on and is ready for charging an electronic device. At block 704, an electronic device with a rechargeable battery may be placed on or otherwise engaged with the auxiliary device by a user. As described above, the electronic device may be aligned with the auxiliary device, for example, by mating matching/complementary features of the electronic device and the auxiliary device, docking the electronic device to a docking socket of the auxiliary device, or using other alignment features when placing the electronic device on or near the auxiliary device.

At block 706, the auxiliary device may detect the presence of the electronic device, for example, using a Hall-effect sensor or based on a change in the load (e.g., inductive or capacitive loading) of the auxiliary device. After detecting the presence of the electronic device, the auxiliary device may begin to charge the electronic device, for example, by transmitting wireless power signals using a coil, at block 708. At block 710, the wireless charging antenna (e.g., a coil) and the wireless charge receiver of the electronic device may receive the wireless power signal and send the received power to a charge manager circuit (e.g., charge manager circuit 536) to charge a rechargeable battery (e.g., battery 522) of the electronic device. At block 714, after the electronic device begins to be charged, the auxiliary device may provide an indication of its status to indicate that the auxiliary device is transmitting wireless power signals to charge the electronic device (charging in progress), for example, via illumination of a particular number, color, and/or pattern of LEDs (e.g., steady green light). Optionally, at block 712, the electronic device may provide an indication of its status to indicate that the electronic device is being charged, for example, via the illumination of a particular number, color, and/or pattern of LEDs (e.g., blinking green light).

At block 716, while the auxiliary device is charging the electronic device, the user may provide an input to the auxiliary device to initiate a hardware shutdown or reset, for example, by sliding a slidable magnet (e.g., magnet 544*a*) of the auxiliary device in a particular pattern and/or for a particular duration to initiate a hardware shutdown or reset. As described above, in some embodiments, the user may slide the magnet to a certain position and hold it for a certain time period T1 (e.g., 5 seconds) to initiate a hardware shutdown or reset. In some embodiments, the user may slide the magnet for a certain number of times to initiate a hardware shutdown or reset. The user input may be detected by a Hall-effect sensor (e.g., Hall-effect sensor 546) and recognized by the MCU (or other suitable controller) of the auxiliary device, which may control the output user interface of the auxiliary device to generate a corresponding status indication (e.g., reset or shutdown initiated) via the illumination of a particular number, color, and/or pattern of LEDs (blinking yellow light) at block 720. The user may continue to hold the magnet at a position a certain time period T2 (e.g., about 15 seconds for hardware rest or about 25 seconds for hardware shutdown) at block 722.

At block 724, a non-contact sensor of the electronic device, such as a Hall-effect sensor (e.g., Hall-effect sensor 524) may detect the magnetic field generated by the magnet and/or the changes in the magnetic field due to the sliding of the magnet, and may determine the non-contact hardware shutdown or reset request based on the detected magnetic field and/or the changes in the magnetic field. The electronic device may then start a hardware shutdown process. As described above, the electronic device may disconnect a battery from the system load of the electronic device immediately or after a certain time delay. For example, the electronic device may start a reset/shutdown timer at block 726 to wait for a time period T3 (e.g., longer than 5 or 10 seconds, such as about 12.5 seconds) that may be shorter than time period T2. After the reset/shutdown timer expires after time period T3 at block 728, the electronic device may disconnect the battery from the system load using a switch at block 730. As described above, the non-contact sensor, the reset/shutdown timer, and the switch may be powered by wireless charging power, rather than the battery, and thus may continue to operation after the battery is disconnected and the rest of the electronic device is shut down. When the user release the slidable magnet after holding the magnet in position for time period T2, the auxiliary device may disable its wireless charge transmitter at block 732. As such, the electronic device may not be charged and may not be powered by the wireless charging power or the battery, and thus may be shut down and remain shut down at block 734.

As shown in FIG. 7B, if the user initiated a hardware reset at blocks 716-722, the auxiliary device may wait for a certain time period T4 (e.g., about 3-5 seconds) at block 736, and may then re-enable its wireless charge transmitter at block 738 and start to provide power to the electronic device, such that the electronic device may restart at block 740 using the power received from the auxiliary device and/or the power from the battery, for example, after the battery is reconnected through the switch and/or a charge manager circuit. The auxiliary device may continue to provide power to the electronic device at block 742, and the battery reconnected to the charge manager circuit may begin charging at block 744. During the charging of the electronic device, the auxiliary device may provide a suitable status indicator (e.g., steady green light) at block 746 to indicate that the auxiliary device is charging the electronic device, and, optionally, the electronic device may provide a suitable status indicator (e.g., blinking green light) at block 748 to indicate that the electronic device is being charged. The reset sequence may complete at block 749 when the auxiliary device and the electronic device are in the steady charging state.

As shown in FIG. 7C, if the user initiated a hardware shutdown at block 716-722, the auxiliary device may, after waiting for a time period T4 (e.g., about 3-5 seconds) at block 750, provide a status indicator (e.g., steady or blinking light of a certain color or combination of colors) at block 752 indicating that the electronic device is shut down and is not charging, and thus can be safely removed. The status indicator may signal the user to remove the electronic device from the auxiliary device at block 754 to complete the shutdown sequence at block 762. In some embodiments, after providing the status indicator, the auxiliary device may wait for a time period T5 (e.g., about 30 seconds) at block 756, to give user sufficient time to remove the electronic device. After waiting for time period T5, the auxiliary device may re-enable its wireless charge transmitter at block 758 and may provide a status indicator at block 760 to indicate that the auxiliary device is powered on and may be ready to charge a device.

Figure 8:
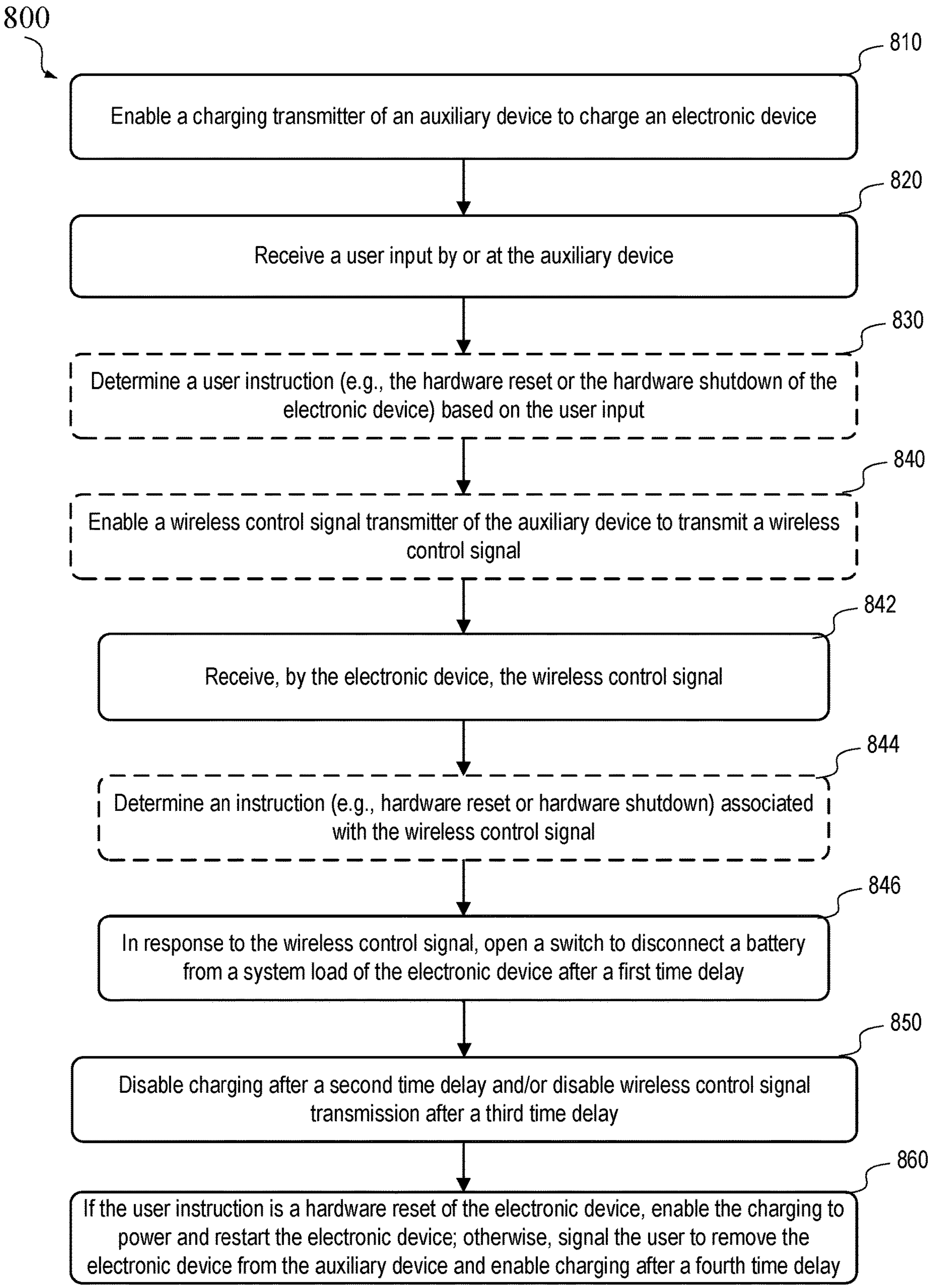
FIG. 8 is a flow diagram illustrating an example of a method of non-contact hardware shutdown and/or reset of an electronic device according to certain embodiments.

FIG. 8 includes a flow diagram 800 illustrating an example of a method of non-contact hardware reset/shutdown according to certain embodiments. It is noted that the specific operations illustrated in FIG. 8 provide a particular process of non-contact hardware reset/shutdown. Other sequences of operations may be performed according to alternative embodiments. Moreover, the individual operations illustrated in FIG. 8 may include multiple sub-steps that may be performed in various sequences as appropriate to the individual operation. Furthermore, additional operations may be added as shown in, for example, FIGS. 6A-7B, or some operations may not be performed depending on the particular applications. One of ordinary skill in the art would recognize many variations, modifications, and alternatives. The operations described in flow diagram 800 may be performed by, for example, system 100, 300, 400, or 500 described above, first assembly 910 of medical device 900, charging device 1000, or electronic device 1200 described below.

Operations at block 810 may include enabling the charging of an electronic device by, for example, enabling a charging transmitter of an auxiliary device. In some embodiments, the charging transmitter may be a wired charging transmitter, and the electronic device may be plugged to the auxiliary device or connected to the auxiliary device using a cable. In some embodiments, the charging transmitter may be a wireless charging transmitter, and the electronic device may be placed on, docked to, engaged with, or otherwise placed in the vicinity of the auxiliary device, where the wireless power signal transmitting coil (e.g., wireless power signal transmitting coil 352, 452, or 552) of the auxiliary device may be aligned with the wireless charge receiving coil (e.g., coil 332, 432, or 532) of the electronic device, and the wireless control signal transmitter (e.g., electromagnetic coil 344, IR emitter 444, or slidable magnet 544) of the auxiliary device may be aligned with the non-contact sensor (e.g., Hall-effect sensor 324 or 524, or IR receiver 424) of the electronic device. As described above, electric power signals transmitted by the charging transmitter of the auxiliary device wirelessly or using a wire may be used to charge the battery, for example, through a charging interface (e.g., an input port, a coil, a wireless charge receiver, and/or a charge manager circuit), and may also be used to power circuits for controlling the shutdown of the electronic device, such as the non-contact sensor and the control circuits (e.g., the reset/shutdown timer(s)). In some embodiments, the auxiliary device and/or the electronic device may provide a status indication, such as the illumination of a particular number, color, and/or pattern (e.g., steady or blinking) of LEDs.

Operations at block 820 may include receiving a user input at the auxiliary device that may have one or more user interface features for receiving user inputs. As described above, the one or more user interface features may include one or more buttons, one or more switches, a touch screen, a sliding magnet, or a combination thereof. In one example, the one or more user interface features may include one button or switch, where actuating the button or switch for a first time period may indicates a first user instruction (e.g., hardware reset) and actuating the button or switch for a second time period may indicate a second user instruction (e.g., hardware shutdown). In another example, the one or more user interface features may include at least two buttons, where actuating a first one of the two buttons may indicate a first user instruction (e.g., hardware shutdown), and actuating a second one of the two buttons or both of the two buttons may indicate a second user instruction (e.g., hardware reset). In yet another example, the one or more user interface features may include a slidable magnet, where sliding the slidable magnet for a first number of times may indicate a first user instruction and sliding the slidable magnet for a second number of times may indicate a second user instruction, or holding the slidable magnet at a first position for a first time period may indicate a first user instruction and holding the slidable magnet at a first position for a second time period may indicate a second user instruction.

Optional operations at block 830 may include determining a user instruction based on the user input. For example, the microcontroller of the auxiliary device may determine whether the user requests a hardware reset or a hardware shutdown of the electronic device, based on the manner in which the user actuates the one or more user interface features as described in detail above and below.

In some embodiments, the auxiliary device may, in response to the user instruction, enable a wireless control signal transmitter of the auxiliary device to transmit a wireless control signal for shutting down the electronic device at block 840. As described above, the wireless control signal transmitter may include, for example, an electromagnetic coil that can generate a magnet field when a current is applied, an IR transmitter that may transmit steady or pulsed IR light, or a radio-frequency (RF) transmitter configured to transmit RF signals. The auxiliary device may enable the wireless control signal transmitter by, for example, closing a relay to provide power to the wireless control signal transmitter, and/or provide control signals for generating desired signals. In some embodiments, the wireless control signal may be the same for hardware shutdown and hardware reset. In some embodiments, different wireless control signals may be used for hardware shutdown and hardware reset. In some embodiments, operations at block 840 may not be needed, and the user input at block 820 may be detected by the electronic device. For example, as described above with respect to FIGS. 5 and 7A-7C, sliding a magnet may cause magnetic field changes that may be detected by Hall-effect sensors on both the auxiliary device and the electronic device.

Operations at block 842 may include receiving, by the electronic device, the wireless control signal from the auxiliary device. For example, the electronic device may include a non-contact sensor, such as a Hall-effect sensor or an IR receiver/demodulator that may detect the magnetic field or the IR signal. In some embodiments, the non-contact sensor may detect the wireless control signal only when the amplitude and/or the duration of the wireless control signal are greater than certain threshold values, to avoid false detection. The non-contact sensor may send the detected signal or a trigger signal to a control circuit after detecting the wireless control signal.

In some embodiments, the electronic device may determine an instruction (e.g., hardware reset or hardware shutdown) associated with the wireless control signal at block 844, for example, based on the amplitude, duration, and/or pattern of the wireless control signal, and may generate a trigger signal based on the determined instruction. In some embodiments, a trigger signal may be generated by the on-contact sensor upon detecting the wireless control signal, and the operations at block 844 may not be performed.

Operations at block 846 may include opening, in response to receiving the wireless control signal and after a first time delay (may be predetermined and programmed), a switch to disconnect a system load of the electronic device from a battery of the electronic device. For example, the trigger signal generated by the non-contact sensor or other circuits of the electronic device may trigger a reset/shutdown timer. The reset/shutdown timer may include, for example, a clock (e.g., a clock oscillator) and a counter that may count up or down, until a certain counter value is reached. After the first delay time expires, the reset/shutdown timer may generate a control signal to open the switch (e.g., through a battery protection circuit), thereby disconnecting the battery from the system load and a charge manager circuit.

Operations at block 850 may include disabling the wireless charging transmitter after a second time delay (e.g., after the system load of the electronic device is powered down). The auxiliary device may disable the wireless charging transmitter by opening a switch (e.g., switch 342, 442, or 542) to stop providing power to the wireless charging transmitter. In some embodiments, the auxiliary device may also disable the wireless control signal transmitter. Since the wireless charging transmitter of the auxiliary device is disabled and the battery is disconnected, the electronic device may be completely shut down.

Operations at block 860 may include performing, by the auxiliary device based on the user instruction, signaling a user to remove the electronic device from the auxiliary device, or reenabling the wireless charging transmitter to transmit the wireless power signals to the electronic device to restart the electronic device. For example, if the user instruction is a hardware shutdown of the electronic device, the auxiliary device may provide an indication (e.g., an illumination pattern of one or more LEDs) that the electronic device is powered down and is not charged, and thus may be removed. Therefore, the user may remove and store the electronic device that is shut down to save power. If the user instruction is a hardware reset of the electronic device, the auxiliary device may reenable the wireless charging transmitter to transmit wireless power signals to the electronic device to restart the electronic device.

As described above, the electronic devices disclosed herein may be a reusable assembly of a wearable medical device that may be attached to a patient's body (e.g., using a patch or a band) or otherwise carried by the patient. The medical device may include another assembly that may be for one-time use only and may need to replaced or refilled after use. In one example, the medical device may include an infusion pump for delivering therapeutic fluid to the patient.

Figure 9A:
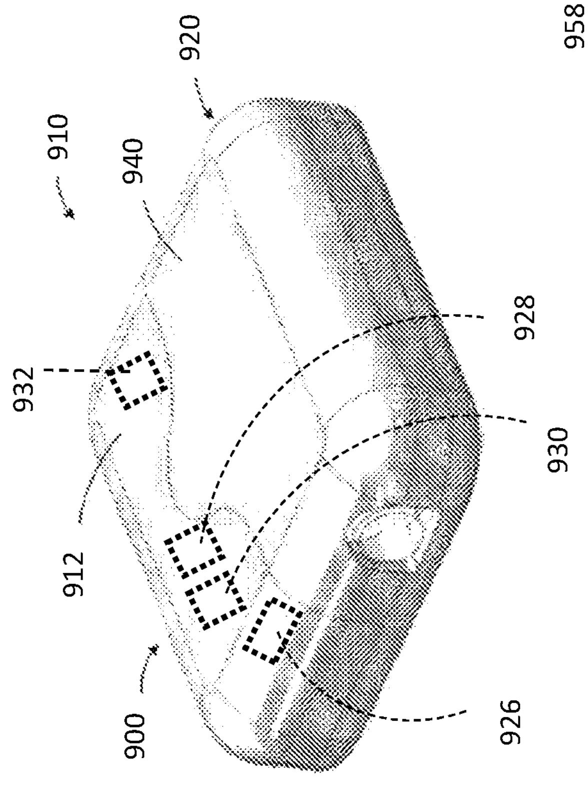
FIGS. 9A-9C are perspective review, exploded perspective views, and top view, respectively, of an example of a medical device according to certain embodiments.
Figure 9B:
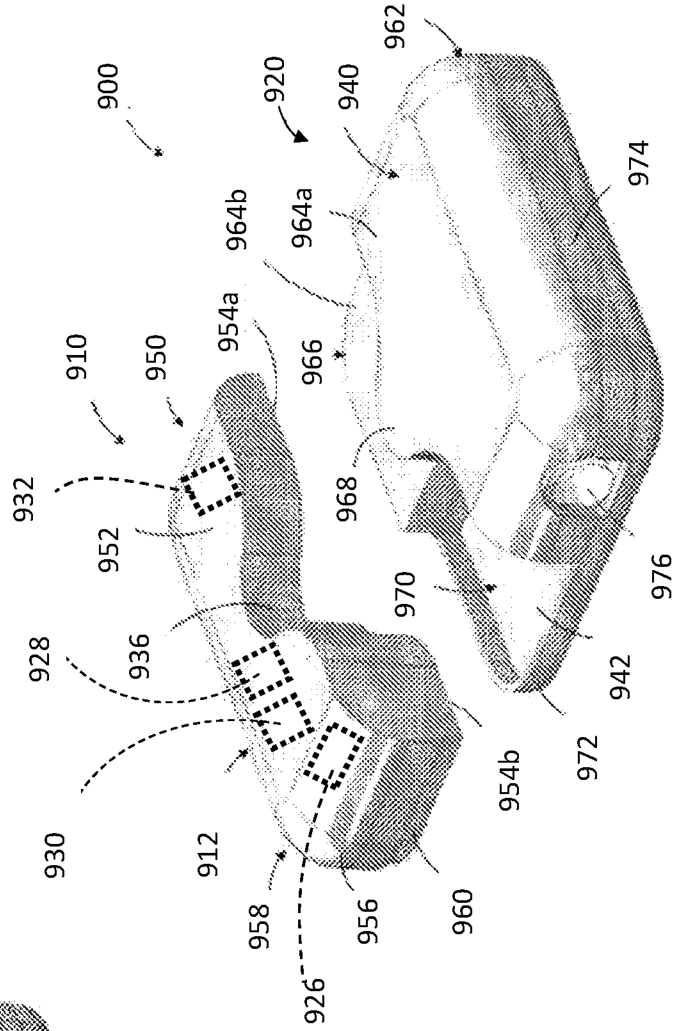
Figure 9C:
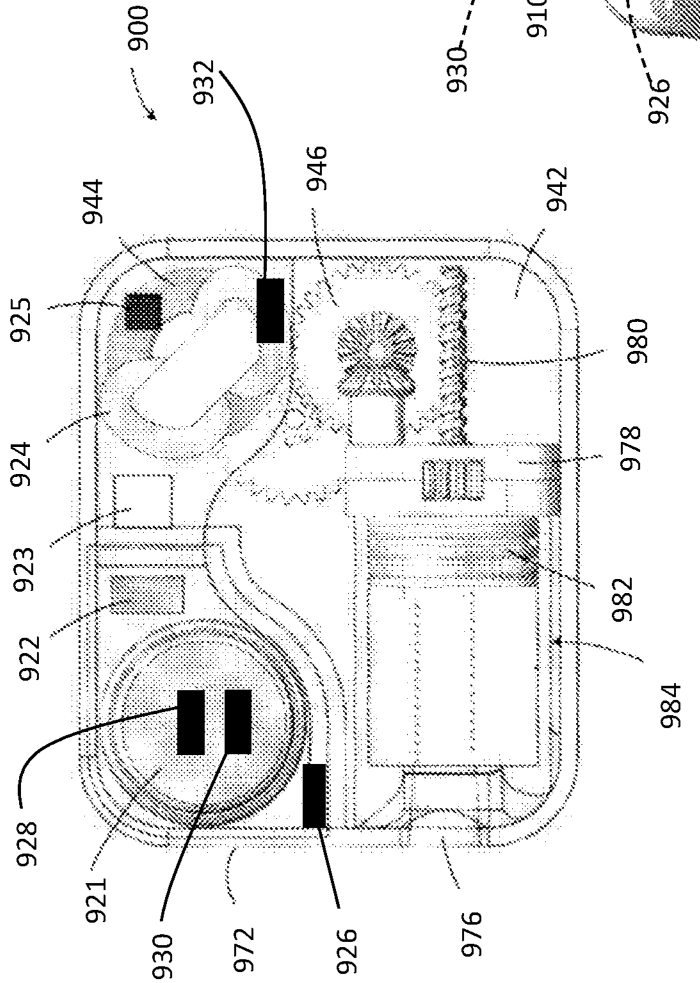

FIGS. 9A-9C are perspective view, exploded perspective view, and top view, respectively, of an example of a medical device 900 according to certain embodiments. In the illustrated example, medical device 900 may be an infusion pump that may be attachable to a user's body to delivery therapeutic fluid (e.g., insulin) to the user. Medical device 900 may include a first assembly 910 and a second assembly 920. First assembly 910 and second assembly 920 may be detachably engaged using certain matching features on first assembly 910 and second assembly 920 as described in detail below. First assembly 910 may be an example of electronic device 120, 204, 320, 420, or 520 described above, and may be reused for controlling the delivery of the therapeutic fluid (e.g., insulin) to the user. Second assembly 920 may be a disposable portion that may include a reservoir storing the therapeutic fluid, and may be replaced, for example, when the reservoir is empty. In another example, medical device 900 may be an analyte sensor that may be used to measure analyte in the user's body, such as interstitial glucose, where first assembly 910 may include the sensor electronics, such as processors and transmitters, while second assembly 920 may include a portion (e.g., sensor electrodes) that may be inserted into the user's body.

First assembly 910 may include components and circuits described above with respect to, for example, FIGS. 1 and 3-5, and thus may be capable of non-contact hardware shutdown and/or reset. In the illustrated example, first assembly 910 may include a housing 912 (e.g., housing 321, 421, or 521) enclosing a battery assembly 921 (e.g., including a rechargeable or non-rechargeable battery); one or more capacitors or other energy storage 922; and a system load (e.g., system load 330, 430, or 530) including, for example, an MCU 923, a coil assembly 924 (which may function as a motor stator), a drive circuit for a motor, and one or more sensors 925 (e.g., temperature sensor, Hall-effect sensor, or other suitable sensors). In some embodiments, housing 912 may also include a non-contact sensor 926 (e.g., Hall-effect sensor 324 or 524, or IR receiver 424) and a switch 928 (e.g., switch 326, 426, or 526) operable to disconnect battery assembly 921 from other components and circuits of first assembly 910, thus enabling non-contact hardware shutdown and/or reset as detailed above. In some embodiments, a timer circuit 930 (e.g., reset/shutdown timer circuit 325, 425, or 525) may be disposed between non-contact sensor 926 and switch 928. A wireless charge receiving coil 932 (e.g., coil 332, 432, or 532) may also be provided to facilitate wireless charging of battery assembly 921. It is noted the positions of the components of first assembly 910 shown in FIGS. 9A-9C are for illustration purposes only. In various embodiments, the components of first assembly 910 may be arranged and placed differently. Even though not shown in FIGS. 9A-9C, first assembly 910 may include additional internal circuitry facilitating non-contact hardware shutdown and/or reset as detailed above with respect to, for example, FIGS. 3-7B.

In the illustrated example, second assembly 920 may include a baseplate 942 supporting a magnetic motor rotor 944 (e.g., configured to be wirelessly driven by coil assembly 924), a gear train 946 including a lead screw drive gear 978, and a lead screw 980 attached to a plunger 982, which may be positioned in a medicament reservoir 984 and may be configured to drive medicament out of medicament reservoir 984. A cover 940 may cooperate with baseplate 942 to enclose some or all of magnetic motor rotor 944, gear train 946 (including lead screw drive gear 978), lead screw 980, plunger 982, and medicament reservoir 984. Medicament reservoir 984 may be, for example, prefilled with therapeutic fluid of various types and/or volumes, depending upon a patient use profile. A connector 976 may be fluidly connected to the output of medicament reservoir 984, for example, for filling medicament reservoir 984, for attaching a cannula for "patch-pump" type configurations, for connecting (directly or indirectly) an infusion set for "pocket-pump" type configurations, and the like.

First assembly 910 and second assembly 920, as noted above, may be releasably engageable with one another. In some embodiments, first assembly 910 and second assembly 920 may be integrated as a single assembly or unit that is wholly disposable or wholly durable. In releasably engageable configurations, housing 912 of first assembly 910 may include a top wall 952, bottom walls **954*a* and 954*b*, and a side wall 956 that cooperate to define a relatively thin portion 950 and a relatively thick portion 958, with an indentation 960 formed in relatively thick portion 958. In some embodiments, housing 912 of first assembly 910 may include a recess 936. Cover 940 of second assembly 920 may be complementary to housing 912 and may include top walls 964*a* and 964*b* and a side wall 974 that cooperate to define a relatively thin cover portion 966 and a relatively thick cover portion 962. In some embodiments as shown in FIG. 9B, a portion of baseplate 942 may not be covered by cover 940, thereby forming a recess 970 bordered by a wall 972 extending around baseplate 942. In some embodiments, cover 940 of second assembly 920 may include a projection 968**.

When first assembly 910 and second assembly 920 are engaged with one another, the relatively thick portion 958 of housing 912 may be received in recess 970 of second assembly 920 with wall 972 extending into indentation 960. In some embodiments, relatively thin portion 950 of housing 912 may reside on top wall **964*b* of cover 940. In some embodiments, projection 968 of cover 940 may mate with recess 936 on housing 912. Thus, in the engaged condition, the complementary features of first assembly 910 and second assembly 920 may form a substantially continuous outer enclosure of medical device 900**, for example, in a substantially rectangular, square, circular, or oval shape.

In some embodiments, medical device 900 may be used in conjunction with a wide variety of remote control devices (not shown in FIGS. 9A-9C), which may be implemented as dedicated devices or applications running on multi-function devices such as, for example, personal electronic devices including smartphones, tablets, laptops, and the like. The remote control devices may be used to, for example, allow the user to transmit instructions to first assembly 910 or second assembly 920, or otherwise facilitate communication between first assembly 910 and the user (e.g., to transfer system data, patient data, use data, other data and metrics, alarms, warnings, etc.). Medical device 900, in the form an infusion pump and including various alternative and additional aspects and features thereof, is described in greater detail in U.S. Pat. No. 10,159,786, the entire content of which is herein incorporated by reference.

Figure 10:
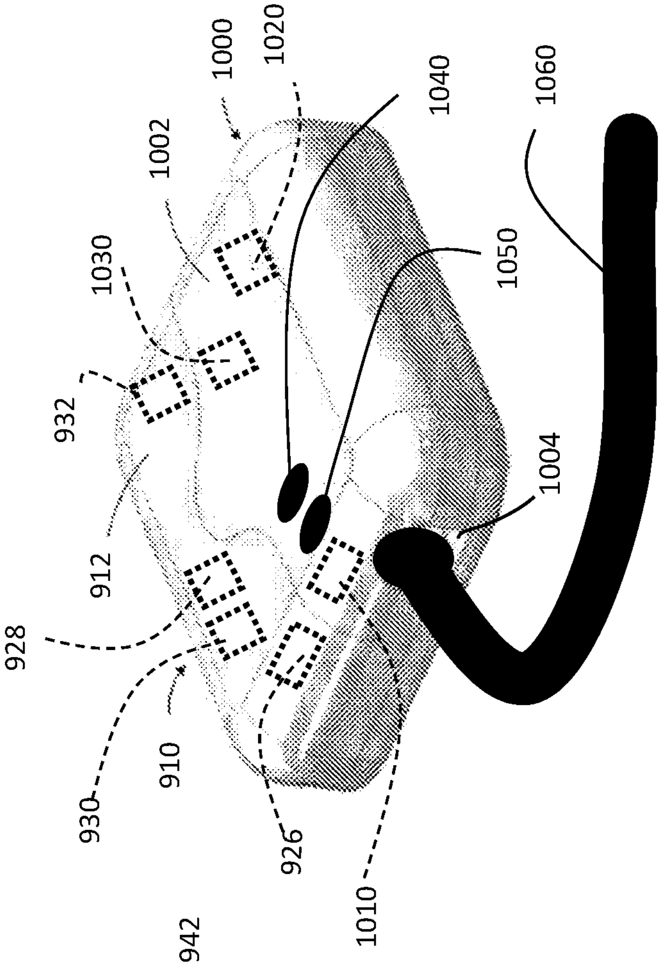
FIG. 10 is a perspective view of an example of a system including an electronic device (e.g., a first assembly of the medical device of FIGS. 9A-9C) and an auxiliary device according to certain embodiments.

FIG. 10 is a perspective view of an example of a system including an electronic device and an auxiliary device according to certain embodiments. In the illustrated example, the electronic device may be first assembly 910 of medical device 900 of FIGS. 9A-9C, and the auxiliary device may be a charging device 1000 with a shape similar to second assembly 920 of medical device 900. Therefore, charging device 1000 may engage with first assembly 910 of medical device 900 (e.g., an infusion pump) to form a system with a substantially continuous outer enclosure, as shown in FIG. 10.

As second assembly 920 of medical device 900, charging device 1000 may include a body 1002 configured similarly as cover 940 of second assembly 920. Therefore, body 1002 may have features complementary to features of housing 912 of first assembly 910, and may engage with housing 912 in a manner similar to the engagement of first assembly 910 with second assembly 920 shown in FIGS. 9A-9C. Charging device 1000 may include a non-contact signal transmitter 1010 configured to be positioned adjacent to non-contact sensor 926 of first assembly 910 when first assembly 910 is engaged with charging device 1000. Charging device 1000 may also include one or more user interface features 1040 and 1050, such as buttons, and an MCU 1020, thereby enabling initiation of non-contact hardware shutdown and/or reset of first assembly 910 similarly as detailed above with respect to FIGS. 1-8. Charging device 1000 may further include a wireless charge transmitting coil 1030 configured for alignment with wireless charge receiving coil 932 of first assembly 910 to enable wireless power transfer therebetween to charge and/or power first assembly 910. Even though not shown in FIG. 10, charging device 1000 may include additional internal control circuitry facilitating non-contact hardware shutdown and/or reset as detailed above. Charging device 1000 may include an input port 1004 (e.g., input port 360, 460, or 560) configured to receive a cable 1060 (e.g., a USB cable) that may be connected to a wall outlet or an adapter to provide power to charging device 1000.

In some embodiments, the non-contact sensor on the electronic device may be replaced by one or more suitable user interfaces, such as a small button within a recess that may be pressed using, for example, a pin, or other features that may not be accidentally actuated. In such embodiments, non-contact signal transmitters may not be used in the auxiliary devices. A user may manually initiate reset or shutdown using the user interfaces on the electronic device.

Figure 11:
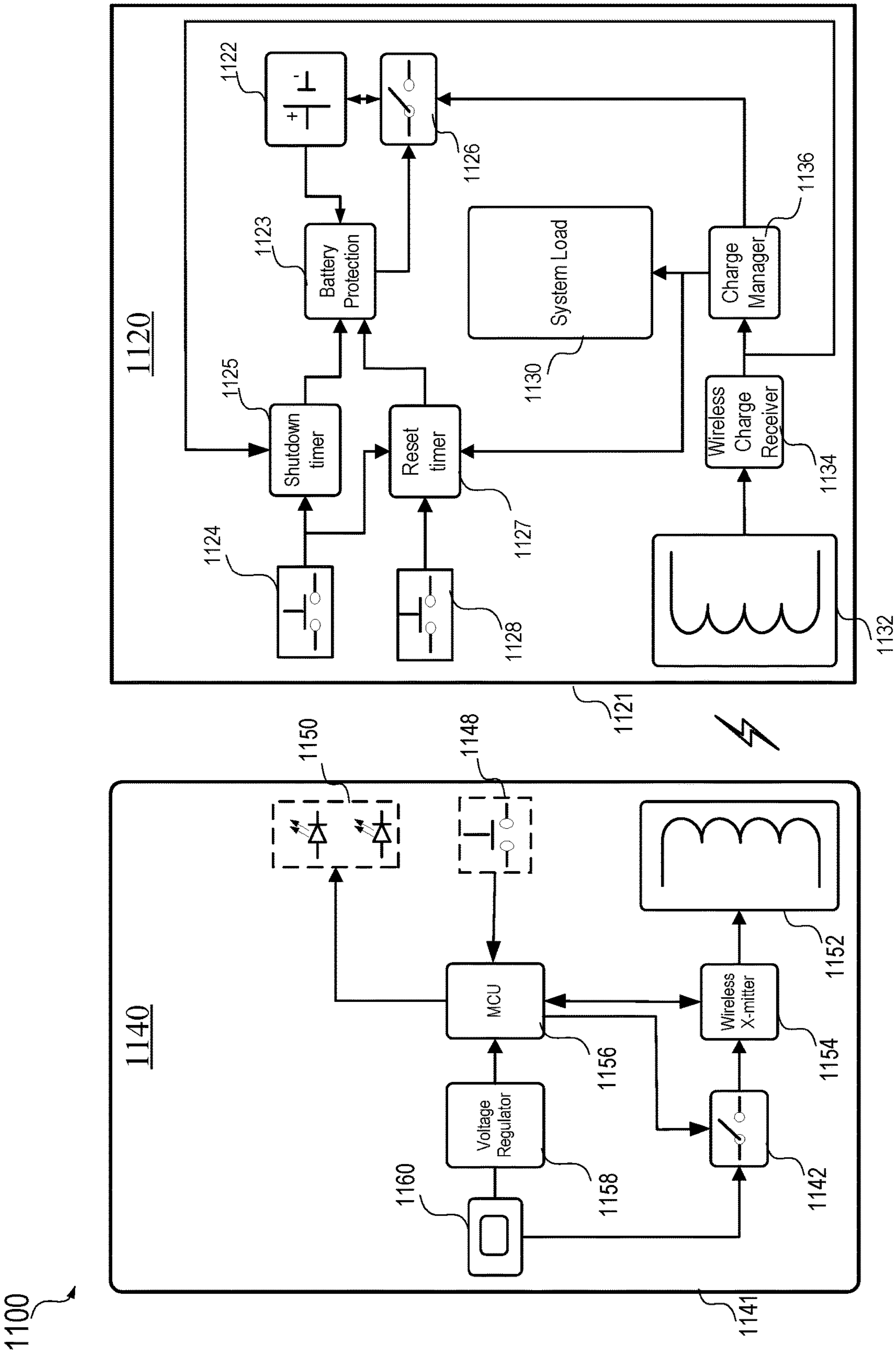
FIG. 11 illustrates an example of a system including an electronic device and an auxiliary device according to certain embodiments.

FIG. 11 illustrates an example of a system 1100 including an electronic device 1120 and a charging device 1140 according to certain embodiments. System 1100 may be similar to system 300, 400, or 500, and may include many features and components similar to or same as corresponding features and components of system 300, 400, or 500. Thus, only differences between system 1100 and system 400 are described in detail hereinbelow while similarities are summarily described or omitted entirely.

In system 1100, electronic device 1120 (e.g., a reusable portion of a medical device, such as first assembly 910 of medical device 900) may include one or more user interfaces (e.g., buttons) that can receive user request for hardware reset or shutdown. Electronic device 1120 may include a wireless power signal receiver, and a rechargeable battery that may be charged through the wireless power signal receiver when electronic device 1120 is engaged with charging device 1140. Therefore, electronic device 1120 may perform hardware shutdown and/or reset by disconnecting and/or reconnecting the rechargeable battery using power received by the wireless power signal receiver from charging device 1140, and charging device 1140 may not need to include user interfaces for receiving user instructions for hardware shutdown and/or reset, and circuitry for initiating the hardware shutdown/reset of electronic device 1120. Electronic device 1120 and charging device 1140 may include complementary engaging features as described above with respect to FIGS. 9A-10, and thus may form a substantially contiguous enclosure and may align properly when they are engaged to chare electronic device 1120.

In the illustrated example, electronic device 1120 may include a housing 1121 and, enclosed therein: a battery assembly including a battery 1122 having one or more battery cells, and a battery protection circuit 1123; buttons 1124 and 1128; a shutdown timer circuit 1125; a reset timer circuit 1127; a switch 1126; a system load 1130; a wireless charging antenna (e.g., a coil 1132); a wireless charge receiver 1134; a charge manager circuit 1136; or a combination thereof. Electronic device 1120 may be similar to electronic device 420 of FIG. 4, except that electronic device 1120 may include button 1124, button 1128, shutdown timer circuit 1125, and reset timer circuit 1127, rather than an IR receiver 424 and a reset/shutdown timer circuit 425. Other components and features of electronic device 1120 may be similar to or same as other components and features of electronic device 420. Shutdown timer circuit 1125 and reset timer circuit 1127 are powered by wireless charge receiver 1134 and/or charge manager circuit 1136, rather than a battery (e.g., battery 1122), and thus may only be functional when electronic device 1120 is charged. Since shutdown timer circuit 1125 and reset timer circuit 1127 are not powered by a battery, they would not be functional during normal operation of electronic device 1120 or when electronic device 1120 is otherwise not charged. As such, during normal operation of electronic device 1120 (not charged), shutdown timer circuit 1125 and reset timer circuit 1127 may not be operational and thus may not accidentally, unintentionally, or other inadvertently shut down/reset electronic device 1120.

Charging device 1140 may include a body 1141 and, included thereon or therein: one or more switches 1142; one or more optional user interfaces which may be in the form of one or more buttons 1148 (and the underlying switches); an output interface including, for example, one or more LEDs 1150; a wireless power signal transmitting coil 1152; a wireless charge transmitter circuit 1154; an MCU 1156; a voltage regulator circuit 1158; an input port 1160 (e.g., a USB port); or a combination thereof. Charging device 1140 may be similar to auxiliary device 440 of FIG. 4, but may not include IR emitter 444, and buttons 1148 may be used for other purposes, rather than for initiating hardware reset or shutdown of electronic device 1120.

In system 1100, user may place electronic device 1120 on or close to charging device 1140, and may use buttons 1124 and/or 1128 to initiate hardware reset or shutdown of electronic device 1120. For example, the user may press and hold button 1124 to initiate a shutdown of electronic device 1120, where the shutdown request received at button 1124 may trigger shutdown timer circuit 1125 to count. Shutdown timer circuit 1125 may generate a signal to open switch 1126 through battery protection circuit 1123, after the shutdown timer expires. When the user presses and holds both buttons 1124 and 1128, a hardware reset may be initiated, where a reset timer circuit 1127 may be triggered to start counting. Reset timer circuit 1127 may generate a first signal to open switch 1126 through battery protection circuit 1123 to shut down electronic device 1120 after a first time delay, and may generate a second signal after a second time delay to close switch 1126 through battery protection circuit 1123 to restart electronic device 1120.

Figure 12:
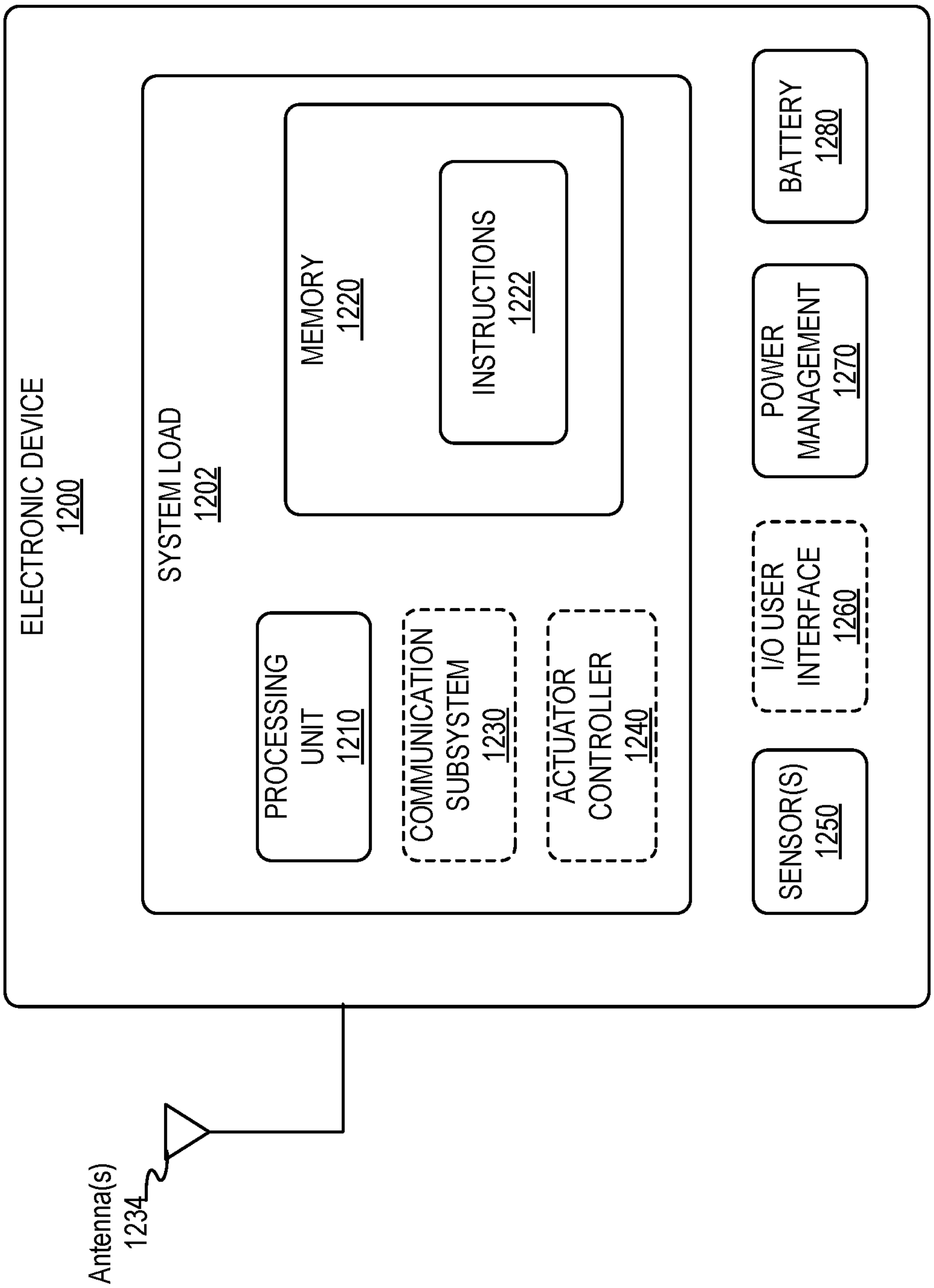
FIG. 12 is block diagram of an example of an electronic device that may implement some of the examples disclosed herein.

FIG. 12 is block diagram of an example of an electronic device 1200 that may implement some of the examples disclosed herein. Electronic device 1200 may be, for example, a part of an infusion pump that may be reused for controlling the delivery of therapeutic fluid (e.g., insulin) to a user, or may be a reusable part of an analyte sensor (e.g., a continuous glucose monitor) for calculating, displaying, and/or transmitting measured analyte levels in the user's body. Electronic device 1200 may be used independently or may be engaged with, for example, a pump or sensor electrodes, and may be attached to a user's body using, for example, a band or a sticking patch.

Electronic device 1200 may include a system load 1202 that may include, for example, a processing unit 1210, a memory device 1220 with instructions 1222 stored thereon, an optional communication subsystem 1230, one or more antennas 1234, and an optional actuator controller 1240. Electronic device 1200 may include one or more sensors 1250, an optional I/O user interface 1260, a power management circuit 1270, and a battery 1280. Electronic device 1200 may include other components and circuits for specific applications not shown in FIG. 12. For example, in some embodiments, electronic device 1200 may also include additional circuits for hardware shutdown and/or reset as described above.

Processing unit 1210 may include without limitation one or more central processing units, microprocessors, microcontrollers, special-purpose processors (e.g., digital signal processors). Processing unit 1210 may be configured to execute instructions 1222 stored in memory device 1220 to perform one or more of the methods described herein and other applications. Memory device 1220 may include one or more transitory and/or non-transitory storage devices, such as, for example, a static random access memory (SRAM), a dynamic random access memory (DRAM), a read-access memory (RAM), a read-only memory (ROM), a programmable read-only memory (PROM), an erasable programmable read-only memory (EPROM), a FLASH-EPROM, a secure digital (SD) card, and any other memory chip or cartridge. Such storage devices may be configured to implement any appropriate data stores, including without limitation, various file systems, data structures, computer-readable instructions, program modules, and the like.

Communication subsystem 1230 may include, for example, an infrared communication device, a wireless communication device and/or chipset (such as a Bluetooth® device, an IEEE 802.11 device, a Wi-Fi device, a WiMax device, cellular communication devices, etc.), and/or similar communication interfaces. One or more antennas 1234 may be used for wireless communication as part of communication subsystem 1230 or as a separate component coupled to any portion of electronic device 1200, such as a wireless charging receiver or a near-field communication receiver. In some embodiments, communication subsystem 1230 may include circuits for wired communication technologies, such as Ethernet, coaxial communications, universal serial bus (USB), and the like. Communications subsystem 1230 may permit data to be exchanged with a network, other computer systems, and/or any other devices. For example, communications subsystem 1230 may be used to receive therapy determinations for therapeutic fluid (e.g., insulin) delivery, such as from a cloud computing system via an intermediary computing device (e.g., a controller) communicatively coupled to electronic device 1200, where processing unit 1210 may, based on the therapy determinations, send commands to actuator controller 1240 to cause the delivery of appropriate amounts of therapeutic fluid (e.g., insulin) to a user. In another example, communications subsystem 1230 may be used to communicate measurement results (e.g., sensor glucose levels) to a computing device (e.g., a smartphone or a personal health monitoring device) and/or to a remote server via the computing device, or receive data (e.g., calibration data, configuration data, etc.) from the computing device or the remote server via the computing device.

Actuator controller 1240 may include control or drive circuits that are used to control, for example, a pump, a motor for moving a plunger to delivery therapeutic fluid, a switch, or other moveable parts. Sensor(s) 1250 may include, for example, an infrared sensor, an accelerometer, a pressure sensor, a temperature sensor, a proximity sensor, a magnetometer, a gyroscope, an inertial sensor (e.g., an inertial measurement unit (IMU)), an ambient light sensor, a position sensor, a depth sensor, or any other similar module operable to provide sensory output and/or receive sensory input.

Input/output user interface 1260 may allow a user to send action requests to electronic device 1200 to perform particular actions, and may provide information (e.g., status of electronic device 1200, measurement results, alerts, etc.) to the user. Input/output user interface 1260 may include one or more input devices, such as, for example, a touchscreen, a touch pad, microphone(s), button(s), dial(s), switch(es), or any other suitable device for receiving action requests and communicating the received action requests to processing unit 1210. In some embodiments, input/output user interface 1260 may include one or more output devices, such as a speaker, a light emitting device, a haptic device, and the like, to provide feedback or alarm to the user.

Battery 1280 may be a rechargeable or non-rechargeable battery, and may include one or more battery cells or other energy storing devices (e.g., capacitors). Power management circuit 1270 may be used to receive power from external devices, such as a charger or a power adaptor, and provide power at appropriate voltage levels to other components and circuits of electronic device 1200. Power management circuit 1270 may also manage the charging of battery 1280. In some embodiments, power management circuit 1270 may include circuits and components for hardware shutdown and/or reset as described above.

In one example, electronic device 1200 may be part of an insulin delivery device (e.g., a pump) that can deliver fast-acting insulin through a small tube configured for fluidic connection with a cannula inserted subcutaneously. Electronic device 1200 may cause the delivery of two types of dosages—a basal dosage, which can be delivered periodically (e.g., every five minutes) in tiny amounts throughout the day and night, and a bolus dosage to cover an increase in blood glucose from meals and/or to correct high blood glucose levels. The insulin delivery device may include a user interface having button elements that can be manipulated to administer a bolus of insulin, to change therapy settings, to change user preferences, to select display features, and the like. The insulin delivery device may also include a display device that can be used to present various types of information or data to the user. In accordance with aspects of the present disclosure, a user of the insulin delivery device may use the button elements to input certain event data (e.g., event type, event start time, event details, etc.), and the user inputs can be confirmed using the display device.

The embodiments disclosed herein are examples of the disclosure and may be embodied in various forms. For instance, although certain embodiments herein are described as separate embodiments, each of the embodiments herein may be combined with one or more of the other embodiments herein. Specific structural and functional details disclosed herein are not to be interpreted as limiting, but as a basis for the claims and as a representative basis for teaching one skilled in the art to variously employ the present disclosure in virtually any appropriately detailed structure. Like reference numerals may refer to like elements throughout the description of the figures.

Any of the herein described techniques, operations, methods, programs, algorithms, or codes may be converted to, or expressed in, a programming language or computer program embodied on a computer, processor, or machine-readable medium. The terms "programming language" and "computer program," as used herein, each include any language used to specify instructions to a computer or processor, and include (but is not limited to) the following languages and their derivatives: Assembler, Basic, Batch files, BCPL, C, C+, C++, Delphi, Fortran, Java, JavaScript, machine code, operating system command languages, Pascal, Perl, PL1, Python, scripting languages, Visual Basic, metalanguages which themselves specify programs, and all first, second, third, fourth, fifth, or further generation computer languages. Also included are database and other data schemas, and any other meta-languages. No distinction is made between languages which are interpreted, compiled, or use both compiled and interpreted approaches. No distinction is made between compiled and source versions of a program. Thus, reference to a program, where the programming language could exist in more than one state (such as source, compiled, object, or linked) is a reference to any and all such states. Reference to a program may encompass the actual instructions and/or the intent of those instructions.

It should be understood that the foregoing description is only illustrative of the present disclosure. To the extent consistent, any or all of the aspects detailed herein may be used in conjunction with any or all of the other aspects detailed herein. Various alternatives and modifications can be devised by those skilled in the art without departing from the disclosure. Accordingly, the present disclosure is intended to embrace all such alternatives, modifications, and variances. The embodiments described with reference to the attached drawing figures are presented only to demonstrate certain examples of the disclosure. Other elements, steps, methods, and techniques that are insubstantially different from those described above and/or in the appended claims are also intended to be within the scope of the disclosure.

While several embodiments of the disclosure have been depicted in the drawings, it is not intended that the disclosure be limited thereto, as it is intended that the disclosure be as broad in scope as the art will allow and that the specification be read likewise. Therefore, the above description should not be construed as limiting, but merely as exemplifications of particular embodiments. Those skilled in the art will envision other modifications within the scope and spirit of the claims appended hereto. The aspects and features of the present disclosure and may be embodied in various forms. Thus, specific structural and functional details disclosed herein are not to be interpreted as limiting, but as a basis for the claims and as a representative basis for teaching one skilled in the art to variously employ the present disclosure in virtually any appropriately detailed structure.

With reference to the appended figures, components that can include memory can include non-transitory machine-readable media. The term "machine-readable medium," "processor-readable medium," and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms "and" and "or," as used herein, may include a variety of meanings that are also expected to depend at least in part upon the context in which such terms are used. In general, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean A, B, C, or any combination of A, B, and/or C, such as AB, AC, BC, AA, ABC, AAB, AABBCCC, or the like.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

In view of this description embodiments may include different combinations of features. Implementation examples are described in the following numbered clauses:

Clause 1. A system comprising:

an auxiliary device comprising: a charging transmitter configured to transmit electric power signals; an input user interface configured to receive a user input; a wireless control signal transmitter configured to transmit wireless control signals; and a microcontroller unit (MCU) configured to, in response to the user input, enable the wireless control signal transmitter to transmit a wireless control signal; and an electronic device comprising: a battery; a system load; a switch in an electrical connection path between the battery and the system load; a non-contact sensor configured to detect the wireless control signal; a control circuit configured to, in response to the detected wireless control signal, open the switch to disconnect the battery and the system load; and a charging interface configured to receive the electric power signals from the auxiliary device, wherein the control circuit and the non-contact sensor are powered through the charging interface rather than the battery.

Clause 2. The system of Clause 1, wherein: the charging transmitter of the auxiliary device is configured to transmit wireless power signals; and the charging interface of the electronic device includes a wireless charge receiver.

Clause 3. The system of Clause 1 or 2, wherein the wireless control signal transmitter includes: an electromagnetic coil configured to generate a magnetic field; an infrared light source configured to emit steady infrared light or infrared light pulses; or a radio-frequency (RF) transmitter configured to transit an RF signal.

Clause 4. The system of any of Clauses 1-3, wherein the input user interface includes one or more buttons, one or more switches, a touch screen, or a combination thereof.

Clause 5. The system of any of Clauses 1-4, wherein: the input user interface includes a button or switch; actuating the button or switch for a first time period indicates a first user instruction; and actuating the button or switch for a second time period indicates a second user instruction.

Clause 6. The system of any of Clauses 1-4, wherein: the input user interface includes two buttons; actuating a first one of the two buttons indicates a first user instruction; and actuating a second one of the two buttons or both of the two buttons indicates a second user instruction.

Clause 7. The system of any of Clauses 1-6, wherein the MCU is configured to:

in response to the user input being an instruction for a hardware shutdown of the electronic device: enable the wireless control signal transmitter; disable the charge transmitter after a first time delay; disable the wireless control signal transmitter after a second time delay; and signal, via an output user interface, a user to disengage the electronic device and the auxiliary device; and in response to the user input being an instruction for a hardware reset of the electronic device: enable the wireless control signal transmitter; disable the charge transmitter after a third time delay; disable the wireless control signal transmitter after a fourth time delay; and enable the charge transmitter to transmit the electric power signals again after a fifth time delay.

Clause 8. The system of any of Clauses 1-7, wherein the non-contact sensor includes a Hall-effect sensor or an infrared light sensor.

Clause 9. The system of any of Clauses 1-8, wherein the control circuit includes a timing circuit configured to control a time delay after detecting the wireless control signal and before opening the switch.

Clause 10. The system of any of Clauses 1-9, wherein the electronic device includes a charge manager circuit between the switch and the system load, the charge manager circuit coupled to the charging interface and configured to: select the charging interface or the battery for powering the system load; or charge the battery, via the switch, using electric power from the charging interface.

Clause 11. The system of any of Clauses 1-10, wherein: the electronic device is a first assembly of a medical device, the electronic device including mechanical features complementary to mechanical features of a second assembly of the medical device such that the electronic device is releasably engageable with the second assembly of the medical device; the auxiliary device includes the mechanical features of the second assembly of the medical device such that the auxiliary device is releasably engageable with the electronic device; and the wireless control signal transmitter and the non-contact sensor are aligned when the electronic device and the auxiliary device are engaged.

Clause 12. The system of any of Clauses 1-11, wherein the auxiliary device includes an output user interface configured to indicate status of the auxiliary device.

Clause 13. A method comprising: enabling a wireless charging transmitter of an auxiliary device to transmit wireless power signals to an electronic device; receiving a user input at the auxiliary device; enabling, in response to the user input, a wireless control signal transmitter of the auxiliary device to transmit a wireless control signal for shutting down the electronic device; receiving, by the electronic device, the wireless control signal from the auxiliary device; opening, in response to receiving the wireless control signal and after a first time delay, a switch to disconnect a system load of the electronic device from a battery of the electronic device; disabling the wireless charging transmitter after a second time delay; and performing, by the auxiliary device based on the user input, signaling a user to remove the electronic device from the auxiliary device; or reenabling the wireless charging transmitter to transmit the wireless power signals to the electronic device to restart the electronic device.

Clause 14. The method of Clause 13, wherein the wireless control signal includes a magnetic field signal, an infrared light signal, or a radio-frequency signal.

Clause 15. The method of Clause 13 or 14, further comprising determining a user instruction based on a duration of the user input, an input device that receives the user input, or both the duration and the input device.

Clause 16. The method of any of Clauses 13-15, further comprising generating, by a timer circuit after the first time delay, a control signal for opening the switch.

Clause 17. A system comprising: an auxiliary device comprising a charging transmitter configured to transmit electric power signals; and an electronic device comprising: a battery; a system load; a switch in an electrical connection path between the battery and the system load; an input user interface configured to receive a user input; a control circuit configured to control the switch in response to receiving the user input; and a charging interface configured to receive the electric power signals from the auxiliary device, wherein the control circuit is powered through the charging interface rather than the battery; wherein the electronic device is a first assembly of a medical device, the electronic device including mechanical features complementary to mechanical features of a second assembly of the medical device such that the electronic device is releasably engageable with the second assembly of the medical device; and wherein the auxiliary device includes the mechanical features of the second assembly of the medical device such that the auxiliary device is releasably engageable with the electronic device.

Clause 18. The system of Clause 17, wherein: the input user interface includes two buttons; actuating a first one of the two buttons indicates a first user instruction; and actuating a second one of the two buttons or both of the two buttons indicates a second user instruction.

Clause 19. The system of Clause 17 or 18, wherein: the control circuit includes two timer circuits; a first timer circuit of the two timer circuits is configured to generate a first switch control signal to open the switch after a first time delay; and a second timer circuit of the two timer circuits is configured to generate a second switch control signal to close the switch after a second time delay.

Clause 20. The system of any of Clauses 17-19, wherein the electronic device includes a charge manager circuit between the switch and the system load, the charge manager circuit coupled to the charging interface and configured to: select the charging interface or the battery for powering the system load; or charge the battery, via the switch, using electric power from the charging interface.

Clause 21. An auxiliary device comprising: a charge transmitter configured to transmit electric power signals; an input user interface for receiving a user input; a wireless control signal transmitter configured to transmit wireless control signals; and a microcontroller unit (MCU) configured to: determine a user instruction based on the user input; enable, in response to the user instruction, the wireless control signal transmitter to transmit a wireless control signal; and control the charge transmitter to selectively transmit the electric power signals according to a timing sequence selected based on the user instruction.

Clause 22. The auxiliary device of Clause 21, wherein the charge transmitter includes a wireless charging transmitter.

Clause 23. The auxiliary device of Clause 21 or 22, wherein the input user interface includes one or more buttons, one or more switches, a touch screen, or a combination thereof.

Clause 24. The auxiliary device of any of Clauses 21-23, wherein: the input user interface includes a button or switch; actuating the button or switch for a first time period indicates a first user instruction; and actuating the button or switch for a second time period indicates a second user instruction.

Clause 25. The auxiliary device of any of Clauses 21-23, wherein: the input user interface includes two buttons; actuating a first one of the two buttons indicates a first user instruction; and actuating a second one of the two buttons or both of the two buttons indicates a second user instruction.

Clause 26. The auxiliary device of any of Clauses 21-25, wherein the wireless control signal transmitter includes: an electromagnetic coil configured to generate a magnetic field; an infrared light source configured to emit steady infrared light or infrared light pulses; or a radio-frequency (RF) transmitter configured to transit an RF signal.

Clause 27. The auxiliary device of any of Clauses 21-26, wherein the user instruction includes a hardware shutdown of an electronic device or a hardware reset of the electronic device.

Clause 28. The auxiliary device of Clause 27, wherein the MCU is configured to:

in response to the user instruction being the hardware shutdown of the electronic device: enable the wireless control signal transmitter; disable the charge transmitter after a first time delay; and signal, via an output user interface, a user to disengage the electronic device and the auxiliary device; and in response to the user instruction being the hardware reset of the electronic device: enable the wireless control signal transmitter; disable the charge transmitter after a third time delay; and enable the charge transmitter to transmit the electric power signals again after a fourth time delay.

Clause 29. The auxiliary device of any of Clauses 21-28, further comprising an output user interface for indicating a status of the auxiliary device.

Clause 30. The auxiliary device of any of Clauses 21-29, further comprising: an input port for receiving electric power from an external source; and a switch connecting the input port to the charge transmitter or the wireless control signal transmitter, the switch controlled by the MCU.

Clause 31. An auxiliary device comprising: a charge transmitter configured to transmit electric power signals; a slidable magnet; a Hall-effect sensor adjacent to the slidable magnet and configured to detect a magnetic field generated by sliding and holding the slidable magnet at one or more locations; and a microcontroller unit (MCU) configured to: determine a user instruction based on the magnetic field; and control the charge transmitter to selectively transmit the electric power signals according to a timing sequence selected based on the user instruction.

Clause 32. The auxiliary device of Clause 31, wherein: sliding the slidable magnet for a first number of times indicates a first user instruction; and sliding the slidable magnet for a second number of times indicates a second user instruction.

Clause 33. The auxiliary device of Clause 31, wherein: holding the slidable magnet at a first position for a first time period indicates a first user instruction; and holding the slidable magnet at the first position for a second time period indicates a second user instruction.

Clause 34. The auxiliary device of any of Clauses 31-33, wherein the user instruction includes a hardware shutdown of an electronic device or a hardware reset of the electronic device.

Clause 35. The auxiliary device of Clause 34, wherein the MCU is configured to:

in response to the user instruction being the hardware shutdown of the electronic device: disable the charge transmitter after a first time delay; and signal, via an output user interface, a user to disengage the electronic device and the auxiliary device; and in response to the user instruction being the hardware reset of the electronic device: disable the charge transmitter after a second time delay; and enable the charge transmitter to transmit the electric power signals again after a third time delay.

Clause 36. The auxiliary device of any of Clauses 31-35, further comprising an output user interface for indicating a status of the auxiliary device.

Clause 37. The auxiliary device of any of Clauses 31-36, further comprising: an input port for receiving electric power from an external source; and a switch connecting the input port to the charge transmitter, the switch controlled by the MCU.

Clause 38. A method comprising, at an auxiliary device: enabling a wireless charging transmitter to transmit wireless power signals to an electronic device; receiving a user input; enabling, in response to the user input, a wireless control signal transmitter to transmit a wireless control signal for shutting down the electronic device; disabling the wireless charging transmitter after a first time delay; and performing, based on the user input, signaling a user to remove the electronic device; or reenabling the wireless charging transmitter to transmit the wireless power signals to the electronic device to restart the electronic device.

Clause 39. The method of Clause 38, wherein the wireless control signal includes a magnetic field signal, an infrared light signal, or a radio-frequency signal.

Clause 40. The method of Clause 38 or 39, further comprising determining a user instruction based on a duration of the user input, an input device that receives the user input, or both the duration and the input device.

Clause 41. An electronic device comprising: a battery; a system load; a switch in an electrical connection path between the battery and the system load; a non-contact sensor configured to detect a wireless control signal associated with an instruction; a control circuit configured to, in response to the detected wireless control signal, open the switch to disconnect the battery and the system load; and a charging interface configured to receive electric power from an external source, wherein the control circuit and the non-contact sensor are powered through the charging interface rather than the battery.

Clause 42. The electronic device of Clause 41, wherein the control circuit includes a timing circuit configured to control a time delay after detecting the wireless control signal and before opening the switch.

Clause 43. The electronic device of Clause 42, wherein the timing circuit includes a clock and a counter.

Clause 44. The electronic device of any of Clauses 41-43, wherein the wireless control signal includes a magnetic field signal, and the non-contact sensor includes a Hall-effect sensor.

Clause 45. The electronic device of any of Clauses 41-43, wherein the wireless control signal includes an infrared light signal, and the non-contact sensor includes an infrared receiver.

Clause 46. The electronic device of any of Clauses 41-45, wherein the charging interface includes a wireless charging receiver.

Clause 47. The electronic device of any of Clauses 41-46, further comprising a charge manager circuit between the switch and the system load, the charge manager circuit coupled to the charging interface and configured to select the charging interface or the battery for powering the system load.

Clause 48. The electronic device of Clause 47, wherein the charge manager circuit is further configured to charge the battery, via the switch, using the electric power from the charging interface.

Clause 49. The electronic device of any of Clauses 41-48, wherein the non-contact sensor is configured to distinguish whether the instruction is a hardware reset or a hardware shutdown of the electronic device.

Clause 50. The electronic device of Clause 49, wherein the non-contact sensor is configured to distinguish whether the instruction is the hardware reset or the hardware shutdown of the electronic device based on: a duration of the wireless control signal; a number of pulses in the wireless control signal; an amplitude of the wireless control signal; or any combination thereof.

Clause 51. The electronic device of Clause 49, wherein the control circuit is configured to cause different timing sequences for the hardware reset and the hardware shutdown.

Clause 52. The electronic device of any of Clauses 41-51, wherein the control circuit includes a battery protection circuit coupled to the battery and the switch, the battery protection circuit configured to control the switch.

Clause 53. The electronic device of any of Clauses 41-52, wherein: the system load includes a microcontroller unit (MCU); and the non-contact sensor, the control circuit, and the switch are independent of the MCU.

Clause 54. The electronic device of any of Clauses 41-53, wherein: the electronic device is a first assembly of an infusion pump; and the electronic device includes mechanical features complementary to mechanical features of a second assembly of the infusion pump such that the electronic device is releasably engageable with the second assembly of the infusion pump.

Clause 55. The electronic device of any of Clauses 41-54, wherein the system load includes a drive circuit of a motor of an infusion pump.

Clause 56. The electronic device of any of Clauses 41-53, wherein the electronic device is a first assembly of an analyte sensor.

Clause 57. The electronic device of any of Clauses 41-56, further comprising a hermetic sealed housing devoid of any input user interface features, the hermetic sealed housing enclosing the battery, the system load, the switch, the non-contact sensor, the control circuit, and the charging interface.

Clause 58. A method comprising, at an electronic device: receiving wireless power signals from a charging device to power a non-contact sensor and a control circuit of the electronic device; receiving, by the non-contact sensor, a wireless control signal from the charging device; generating, by the control circuit in response to the received wireless control signal and after a first time delay that is greater than 1 second, a control signal to open a switch to disconnect a system load from a battery of the electronic device; and ceasing to receive the wireless power signals from the charging device.

Clause 59. The method of Clause 58, further comprising receiving, after a second time delay, the wireless power signals from the charging device again to restart the system load.

Clause 60. The method of Clause 58 or 59, wherein the wireless control signal includes a magnetic field signal, an infrared light signal, or a radio-frequency signal.

What is claimed is:

1. An electronic device comprising:

a battery;

a system load;

a switch in an electrical connection path between the battery and the system load;

a non-contact sensor configured to detect a wireless control signal associated with an instruction;

a control circuit configured to, in response to the detected wireless control signal, open the switch to disconnect the battery and the system load; and a charging interface configured to receive electric power from an external source, wherein the control circuit and the non-contact sensor are powered through the charging interface rather than the battery.

2. The electronic device of claim 1, wherein the control circuit includes a timing circuit configured to control a time delay after detecting the wireless control signal and before opening the switch.

3. An electronic device comprising:

a battery;

a system load;

a switch in an electrical connection path between the battery and the system load;

a non-contact sensor configured to detect a wireless control signal associated with an instruction;

a control circuit configured to, in response to the detected wireless control signal, open the switch to disconnect the battery and the system load, wherein the control circuit includes a timing circuit configured to control a time delay after detecting the wireless control signal and before opening the switch, and wherein the timing circuit includes a clock and a counter; and a charging interface configured to receive electric power from an external source, wherein the control circuit and the non-contact sensor are powered through the charging interface rather than the battery.

4. The electronic device of claim 1, wherein the wireless control signal includes a magnetic field signal, and the non-contact sensor includes a Hall-effect sensor.

5. The electronic device of claim 1, wherein the wireless control signal includes an infrared light signal, and the non-contact sensor includes an infrared receiver.

6. The electronic device of claim 1, wherein the charging interface includes a wireless charging receiver.

7. The electronic device of claim 1, further comprising a charge manager circuit between the switch and the system load, the charge manager circuit coupled to the charging interface and configured to select the charging interface or the battery for powering the system load.

8. The electronic device of claim 7, wherein the charge manager circuit is further configured to charge the battery, via the switch, using the electric power from the charging interface.

9. The electronic device of claim 1, wherein the non-contact sensor is configured to distinguish whether the instruction is a hardware reset or a hardware shutdown of the electronic device.

10. The electronic device of claim 9, wherein the non-contact sensor is configured to distinguish whether the instruction is the hardware reset or the hardware shutdown of the electronic device based on:

a duration of the wireless control signal;

a number of pulses in the wireless control signal;

an amplitude of the wireless control signal; or any combination thereof.

11. The electronic device of claim 9, wherein the control circuit is configured to cause different timing sequences for the hardware reset and the hardware shutdown.

12. The electronic device of claim 1, wherein the control circuit includes a battery protection circuit coupled to the battery and the switch, the battery protection circuit configured to control the switch.

13. The electronic device of claim 1, wherein:

the system load includes a microcontroller unit (MCU); and the non-contact sensor, the control circuit, and the switch are independent of the MCU.

14. The electronic device of claim 1, wherein:

the electronic device is a first assembly of an infusion pump; and the electronic device includes mechanical features complementary to mechanical features of a second assembly of the infusion pump such that the electronic device is releasably engageable with the second assembly of the infusion pump.

15. An electronic device comprising:

a battery:

a system load, wherein the system load includes a drive circuit of a motor of an infusion pump;

a switch in an electrical connection path between the battery and the system load;

a non-contact sensor configured to detect a wireless control signal associated with an instruction;

a control circuit configured to, in response to the detected wireless control signal, open the switch to disconnect the battery and the system load; and a charging interface configured to receive electric power from an external source, wherein the control circuit and the non-contact sensor are powered through the charging interface rather than the battery.

16. The electronic device of claim 1, wherein the electronic device is a first assembly of an analyte sensor.

17. The electronic device of claim 1, further comprising a hermetic sealed housing devoid of any input user interface features, the hermetic sealed housing enclosing the battery, the system load, the switch, the non-contact sensor, the control circuit, and the charging interface.

* * * * *